(12) United States Patent
Gabor et al.

(10) Patent No.: US 12,455,505 B2
(45) Date of Patent: Oct. 28, 2025

(54) METHOD FOR FORMING CONTINUOUS LINE-END TO LINE-END SPACES WITH SPACER ASSISTED LITHOGRAPHY-ETCH-LITHOGRAPHY ETCH PROCESSES

(71) Applicant: International Business Machines Corporation, Armonk, NY (US)

(72) Inventors: Allen Gabor, Katonah, NY (US); Geng Han, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 697 days.

(21) Appl. No.: 17/657,493

(22) Filed: Mar. 31, 2022

(65) Prior Publication Data

US 2023/0314952 A1    Oct. 5, 2023

(51) Int. Cl.
  *G03F 7/20*   (2006.01)
  *H01L 21/027*  (2006.01)

(52) U.S. Cl.
  CPC .......... *G03F 7/2043* (2013.01); *G03F 7/2016* (2013.01); *H01L 21/0276* (2013.01)

(58) Field of Classification Search
  CPC . G03F 7/2043; G03F 7/2016; H01L 21/0276; H01L 21/76816; H01L 21/0337
  USPC .................................................. 430/208, 311
  See application file for complete search history.

(56) References Cited

U.S. PATENT DOCUMENTS

| | | | |
|---|---|---|---|
| 5,916,821 A | 6/1999 | Kerber | |
| 8,782,586 B2 | 7/2014 | Sezginer et al. | |
| 8,865,600 B2 | 10/2014 | Lee et al. | |
| 8,889,550 B2 | 11/2014 | Belledent et al. | |
| 9,156,306 B2 | 10/2015 | Pain et al. | |
| 9,564,327 B2 | 2/2017 | Lee et al. | |
| 9,773,676 B2 | 9/2017 | Chang et al. | |
| 11,037,789 B2 | 6/2021 | Huang et al. | |
| 2019/0318928 A1* | 10/2019 | Mignot | H01L 21/3081 |
| 2020/0111677 A1* | 4/2020 | Srivastava | H01L 21/76816 |
| 2021/0050417 A1 | 2/2021 | Shulaker et al. | |
| 2021/0082746 A1 | 3/2021 | Arnold et al. | |
| 2021/0305089 A1* | 9/2021 | Philip | H01L 21/31144 |

* cited by examiner

*Primary Examiner* — Caleen O Sullivan
(74) *Attorney, Agent, or Firm* — Patterson + Sheridan, LLP

(57) ABSTRACT

Method and apparatus for improved and efficient spacer assisted lithography-etch-lithography etch (SALELE) processes that utilize a spin-on-material layer, where the spin-on-material layer fills gaps between spacers to protect line-end to line-end spaces created by a cut shape. The method and structures also include a final resist layer with varying critical dimensions (CDs). The use of the spin-on-material enables back end of line (BEOL) metal designs with continuous line-end to line-end spacing above a minimum that can be patterned with a cut mask and spacer only process.

19 Claims, 22 Drawing Sheets

METHOD FOR FORMING CONTINUOUS LINE-END TO LINE-END SPACES WITH SPACER ASSISTED LITHOGRAPHY-ETCH-LITHOGRAPHY ETCH PROCESSES

BACKGROUND

The present invention relates to processes in semiconductor fabrication, and more specifically, to using spacer assisted lithography-etch-lithography-etch processes to form continuous metal lines with line-end to line-end spaces above minimum distances than conventionally allowed.

Some conventional approaches for minimizing line-end spaces requires complicated and costly processes to try to achieve line-end spaces below a given fabrication limit, but these approaches add additional fabrication steps and fabrication equipment to achieve the smaller line-end spaces.

SUMMARY

One example embodiment includes a method. The method also includes forming a first mandrel and a second mandrel with a cut space, where the first mandrel and the second mandrel may include a tip-to-tip distance across the cut space between the first mandrel and the second mandrel; forming a spacer layer on the first mandrel and the second mandrel, where the spacer layer fills a portion of the cut space. The method also includes forming a next layer on the spacer layer to fill a remaining portion of the cut space, forming a final resist layer with a first critical dimension (CD) in a first cross-section and a second CD in a second cross-section to form a final resist stack; and processing the final resist stack to expose a first hardmask layer, where the first hardmask layer may include a pattern for metal line structures with preserved line-end to line-end spaces corresponding to the cut space.

One example embodiment includes a resist stack. The resist stack includes a first mandrel, a second mandrel, and a cut space positioned between the first mandrel and the second mandrel. The cute space may include a tip-to-tip distance across the cut space between the first mandrel and the second mandrel, a spacer layer formed on first mandrel, the second mandrel, and within a first portion of the cut space, and a next layer formed on the spacer layer, where the next layer fills a remaining portion of the cut space. The resist stack also includes a resist layer formed on the spacer layer and the next layer and may include: a first patterned resist section may include a first critical dimension (CD) in a first cross-section of the resist stack through the first mandrel, and a second patterned resist section may include a second CD in a second cross-section of the resist stack through the cut space.

One example embodiment includes a spacer assisted lithography-etch-lithography-etch (SALELE) method. The method includes forming a first mandrel and a second mandrel using a cut space, forming a spacer layer on the first mandrel and the second mandrel, where the spacer layer fills a portion of the cut space, and forming a next layer on the spacer layer to fill a remaining portion of the cut space. The method also includes forming a final resist layer, which may include a first critical dimension (CD) in a first cross-section through a mandrel of the first mandrel and the second mandrel and a second CD in a second cross-section through the cut space, to form a final resist stack; and processing the final resist stack to expose a first hardmask layer, where the first hardmask may include a pattern for metal line structures with preserved line-end to line-end spaces corresponding to the cut space.

DETAILED DESCRIPTION

Spacer assisted lithography-etch-lithography etch (SALELE) is increasingly used in back end of line (BEOL) metallization processes in semiconductor fabrication. SALELE processes use spacer layer(s) to broaden the acceptable tolerances of a second lithography exposure (e.g., broadened the robustness of the process to critical dimension (CD) variability, line edge roughness (LER), overlay error, etc.). In some examples, without using a spacer, the tolerances required on the second exposure would be significantly tighter to avoid too small a space between features exposed with the second exposure and features exposed with the first exposure.

Some example SALELE processes utilize a cut mask(s), but are these processes are limited in the distance than can be achieved between metal line-ends. For example, a SALELE process with cuts limits the line-end to line-end distance relative to a thickness of a spacer layer applied in cut. Additionally, while some augmented SALELE methods provide larger line-end distances than the standard SALELE, these methods rely on more complicated and costly tone reversal processes and often apply multiple cut masks to achieve larger line-end to line-end distances.

The methods and structures described herein provide improved and efficient SALELE processes that utilize a spin on material layer, where the spin-on-material layer fills gaps between spacers to protect line-end to line-end spaces created by a cut shape. The method and structures also include a final resist layer with varying critical dimensions (CDs). The use of the spin-on-material enables BEOL metal designs with continuous line-end to line-end spacing above a minimum that can be patterned with a cut mask and spacer only process.

Figure 1:
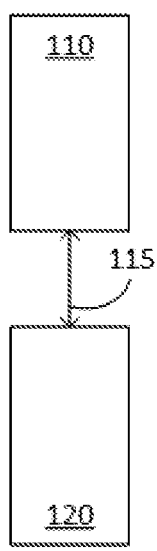
FIG. 1 illustrates a line-end to line-end space, according to embodiments of the present disclosure.

FIG. 1 illustrates a line-end to line-end space, according to embodiments of the present disclosure. FIG. 1 includes a metal line 110 and a metal line 120 formed in BEOL processes. The metal line 110 and the metal line 120 have a line-end to line-end distance, distance 115, between the lines. As described above, the distance 115 is limited relative to a thickness of a space layer using standard SALELE processes. For example, the in order to ensure the void between intermediary structures (e.g., mandrels, etc.) is preserved by the spacer layer, the spacer layer would have to completely fill a gap (e.g., pinch off in the gap) between the intermediary structures. Thus for standard SALELE processes, the distance 115 is limited to twice the thickness of the spacer layer.

In order to increase the distance 115 while preserving the void or space between the metal lines 110 and 120, the methods described in relation to FIG. 2-15D provide for using a spin-on-material to preserve the line-end to line-end space between various metal lines.

Figure 2:
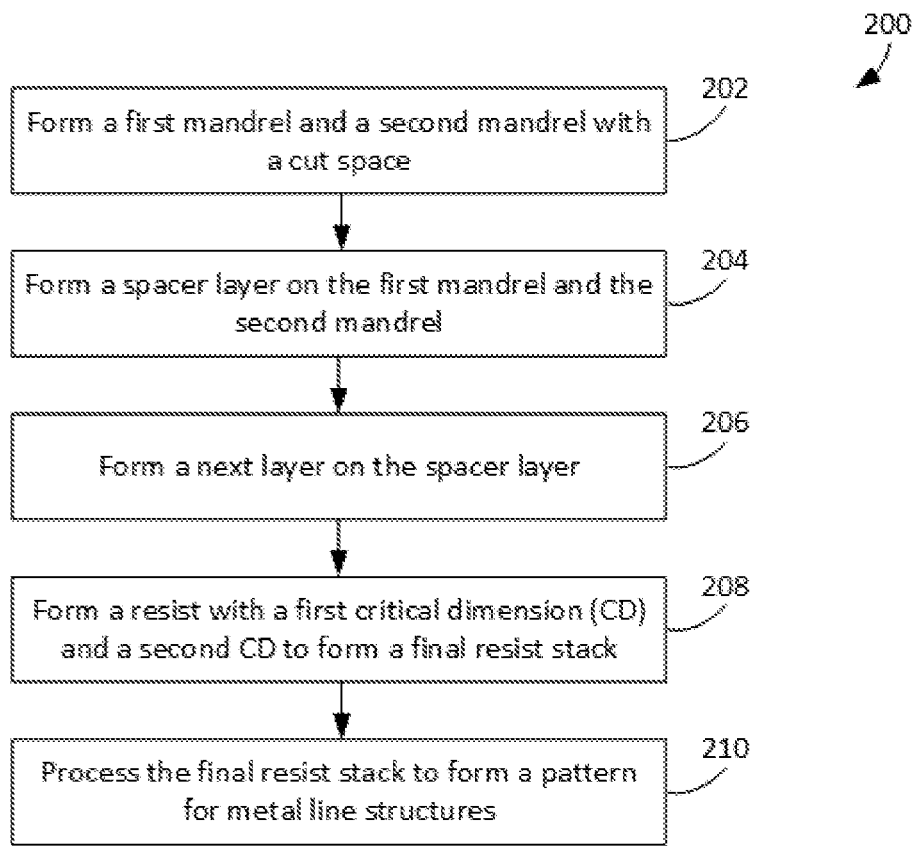
FIG. 2 is a flowchart of a method for fabrication of a semiconductor device, according to embodiments of the present disclosure.

FIG. 2 is a flowchart of a method 200 for fabrication of a semiconductor device, according to embodiments of the present disclosure. For ease of discussion, throughout the discussion of the method 200 reference is made to various views of intermediary fabrication structures described in relation to FIG. 3A-15D. Additionally, method 200 is described as being performed by a fabricator, which may include any type of semiconductor fabrication device configured to perform the fabrication operations and steps described herein.

While described herein in relation to forming structures to preserve a single line-end-to-line-end space, the method 200 and the methods described in relation to FIGS. 3A-15D may be utilized to simultaneously form multiple similar components on the fabrication structures, etc. For example, multiple mandrels and corresponding structures, including structures and layers with varying CDs, may be formed using the methods described herein to provide a hardmask pattern for multiple metal line structures.

Method 200 begins at block 202, where the fabricator forms a first mandrel and a second mandrel with a cut space. In some examples, the fabricator forms starting stacks or other structures to form a base structure from which to form the first mandrel and the second mandrel. For example, as shown in FIGS. 3A-B the fabricator forms a starting stack 300.

Figure 3A:
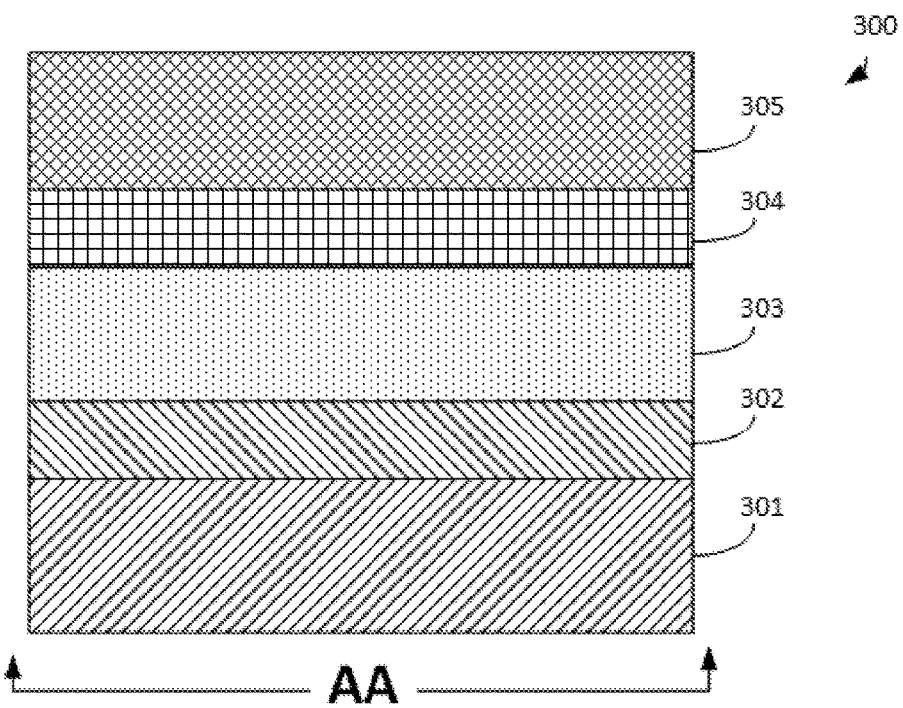
FIG. 3A-15D illustrate several views of a resist stack during fabrication according to the method described in relation to FIG. 2, according to embodiments of the present disclosure.
Figure 3B:
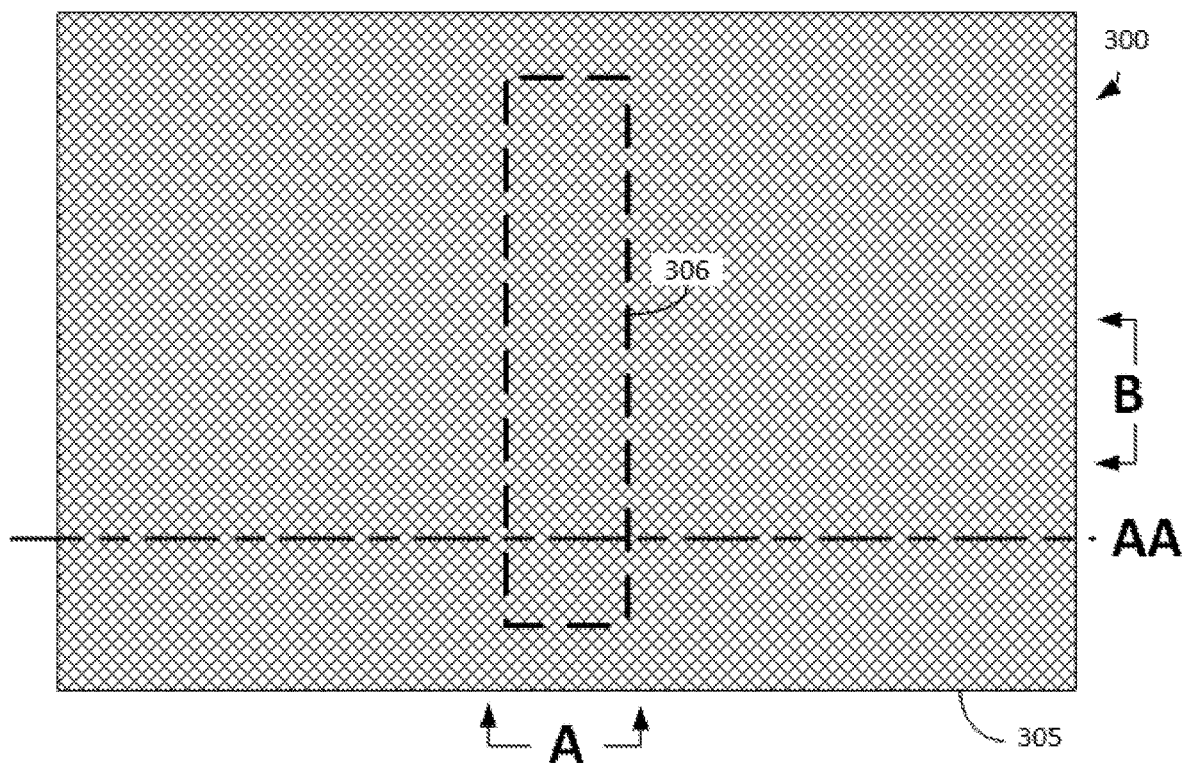

FIG. 3A is a cross-section view of the starting stack 300 along a cross-section AA and viewed from perspective A as shown in FIG. 3B. FIG. 3B is a top view of the starting stack 300. In some examples, the fabricator forms the starting stack by forming a substrate 301 and a hardmask layer 302 on the substrate 301. The fabricator also forms a mandrel material layer 303, a hardmask layer 304 on the mandrel material layer 303, and a photoresist layer, resist layer 305, on the hardmask layer 304. In some examples, the mandrel material layer 303 is an amorphous Si (aSi) layer (e.g., TiN) and the resist layer 305 is a resist stack with a resist layer and a bottom anti-reflective coating (BARC). The hardmask layers include hardmask materials such as self-aligned contact nitride hardmasks, aSi based hardmasks, etc.

The fabricator also patterns a first resist layer in a starting stack to form additional structures from the starting stack 300. For example, the fabricator patterns outline 306 on the top of the starting stack 300 and applies a first litho-etch process to form an initial mandrel structure shown in FIGS. 4A-B.

Figure 4A:
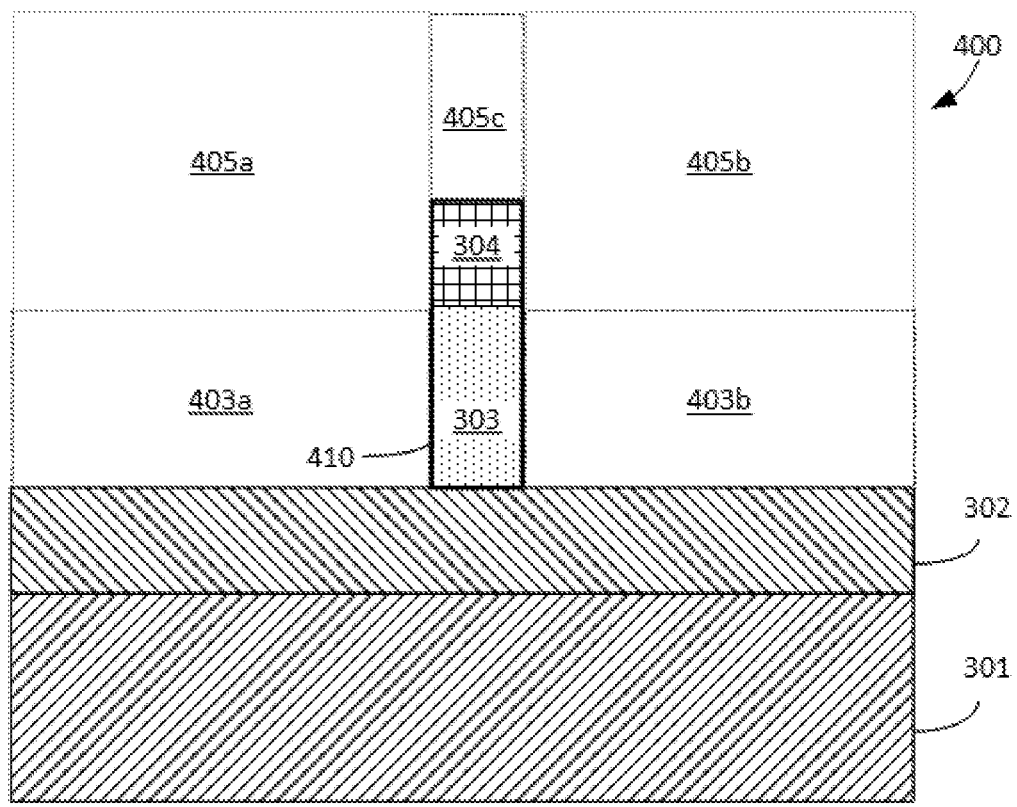
Figure 4B:
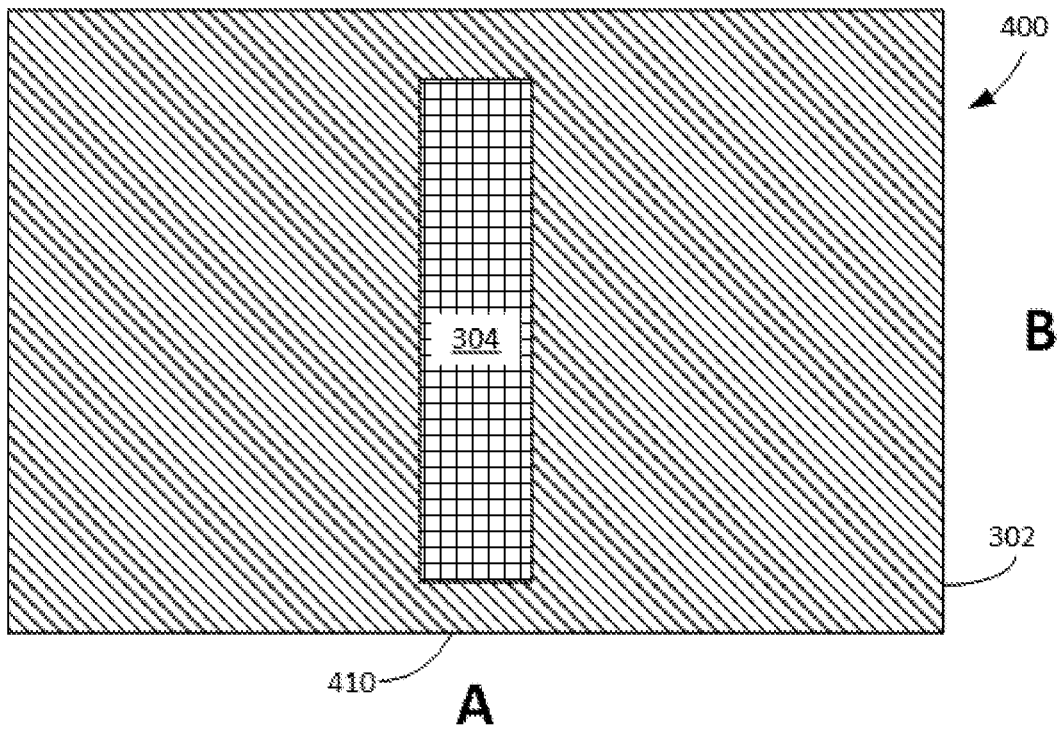

FIG. 4A is a cross-section view of a structure 400 along the cross-section AA (shown in FIG. 3B) and viewed from perspective A, shown in FIG. 4B. FIG. 4B is a top view of the structure 400 after processing, as described herein. In some examples, the fabricator applies a litho-etch process to remove a first portion of the first resist layer and first portion of a second hardmask layer to expose a first portion of a mandrel material layer in the starting layer stack. For example, the fabricator removes portions 405a and 405b from the resist layer 305 and the hardmask layer 304 to expose portions 403a and 403b of the mandrel material layer 303. In some examples, the fabricator also removes a remainder of the first resist layer, such as portion 405c to prepare the structure 400 for a next etching step.

The fabricator also etches the exposed first portion of the mandrel material layer to form the initial mandrel structure, where the initial mandrel structure includes a section of the mandrel material layer and a section of a hardmask layer. For example, the fabricator etches the structure 400 to remove the exposed portions of the mandrel material layer, portions 403a and 403b. In some examples, these steps form the initial mandrel structure 410, which extends in a direction across the hardmask layer 302 along a perspective B shown in FIG. 4B. The initial mandrel structure 410 includes a section/layer of mandrel material (e.g., remaining mandrel material from mandrel material layer 303) and a section/layer of hardmask material (e.g., remaining hardmask from hardmask layer 304). For example, as shown in the top view of structure 400 in FIG. 4B, the hardmask layer 304 remains positioned on a top of the remaining portion of the mandrel material layer 303 in the initial mandrel structure 410. In some examples, the fabricator forms individual mandrel structures from the initial mandrel structure 410 as described in relation to FIGS. 5A-C.

Figure 5A:
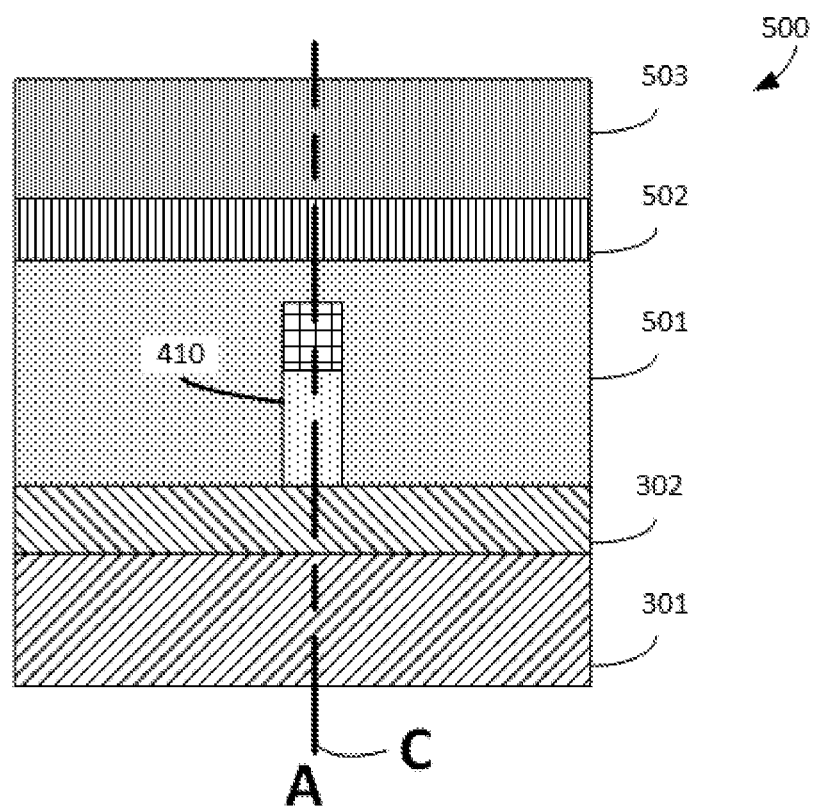
Figure 5B:
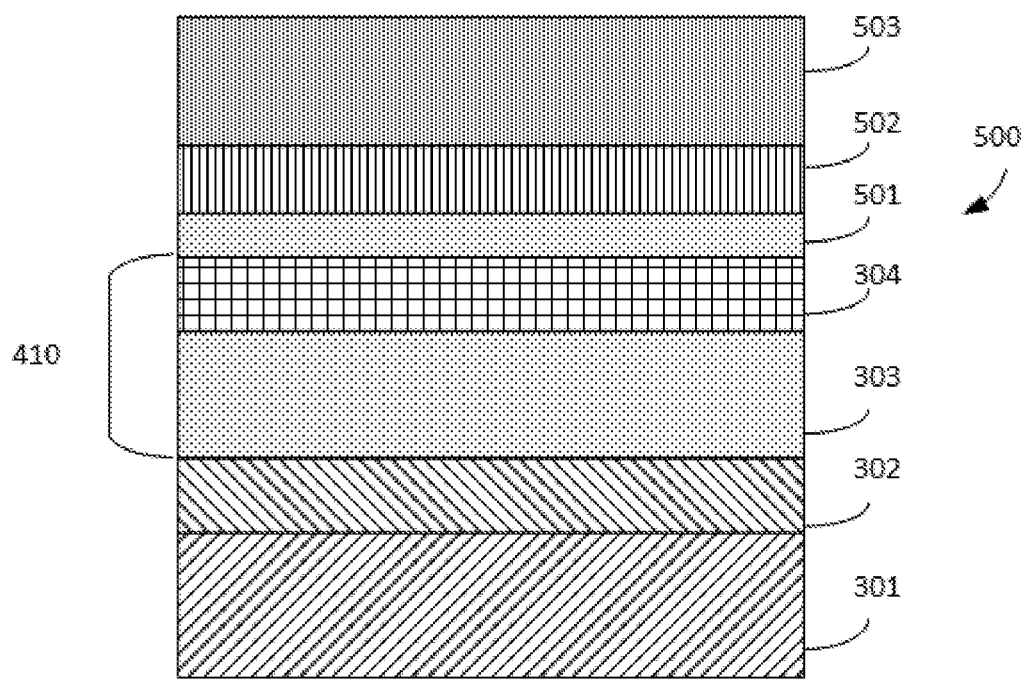
Figure 5C:
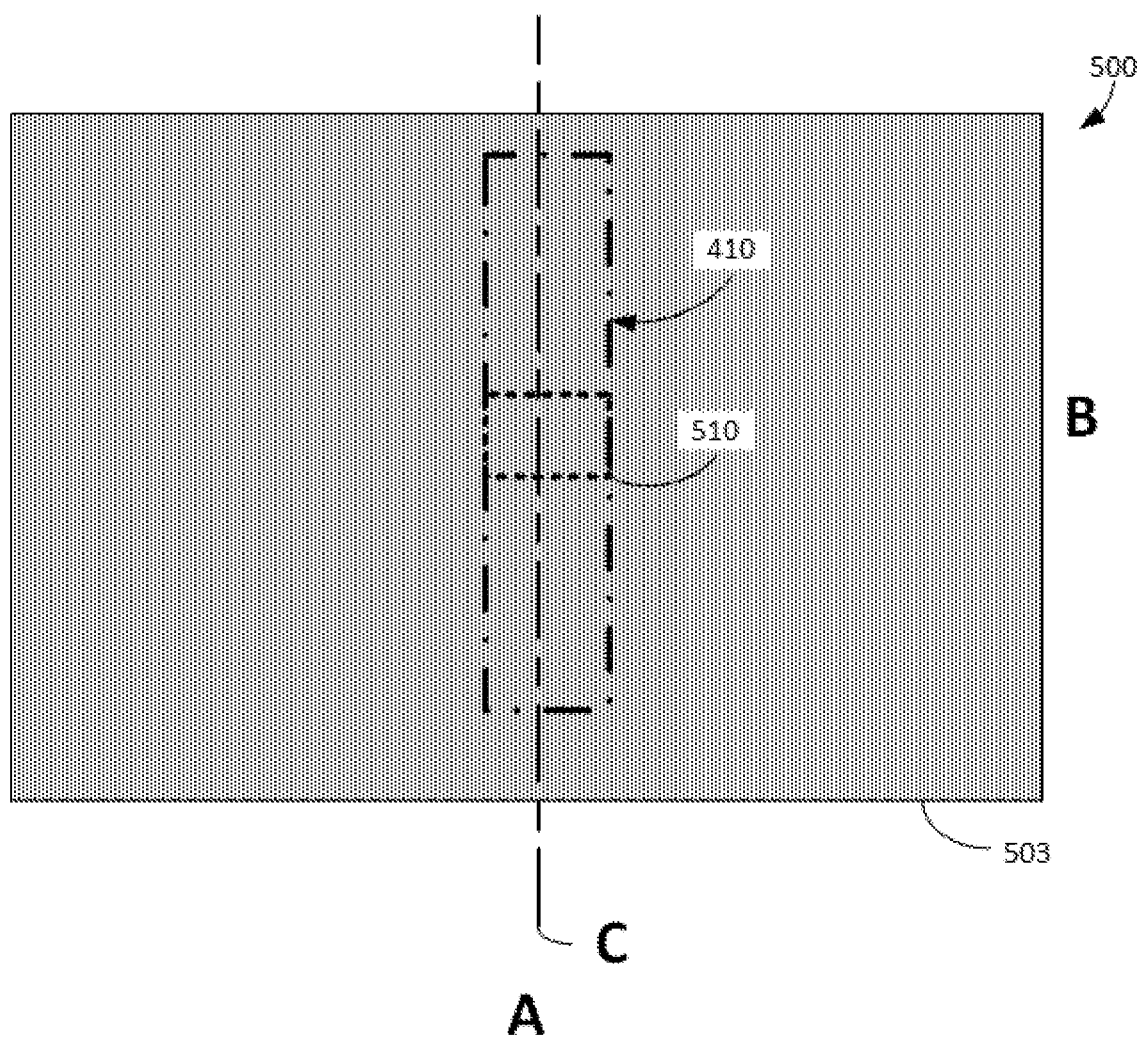

FIG. 5A is a cross-section view of a structure 500 along the cross-section AA (shown in FIG. 3B) and viewed from perspective A, shown in FIG. 5C. FIG. 5B is a cross-section view of the structure 500 along a cross-section C (shown in FIGS. 5A and 5C) and viewed from perspective B, shown in FIG. 5C. FIG. 5C is a top view of the structure 500 after processing, as described herein.

In some examples, to form the first mandrel and the second mandrel the fabricator first forms an organic planarization layer (OPL) on the first hardmask layer and the initial mandrel structure, such as OPL layer 501. For example, the OPL layer 501 is formed over hardmask layer 302 and the initial mandrel structure 410 as shown in FIGS. 5A and 5B. The fabricator also forms a silicon containing Anti-Reflective Coating (SiARC) layer on the OPL such as SiARC layer 502, and a second resist layer on the SiARC layer, such as resist layer 503. In some examples, the fabricator also patterns a cut space pattern on the second resist layer, such as pattern 510 shown in FIG. 5C. In the top view of FIG. 5C, an outline of the initial mandrel structure 410 is shown for reference, but the structure is covered by the layers described above, including resist layer 503. Using the pattern 510, the fabricator removes material from the structure 500 using a litho-etch process to form a cut space through the initial mandrel structure 410 as described in FIGS. 6A-B.

Figure 6A:
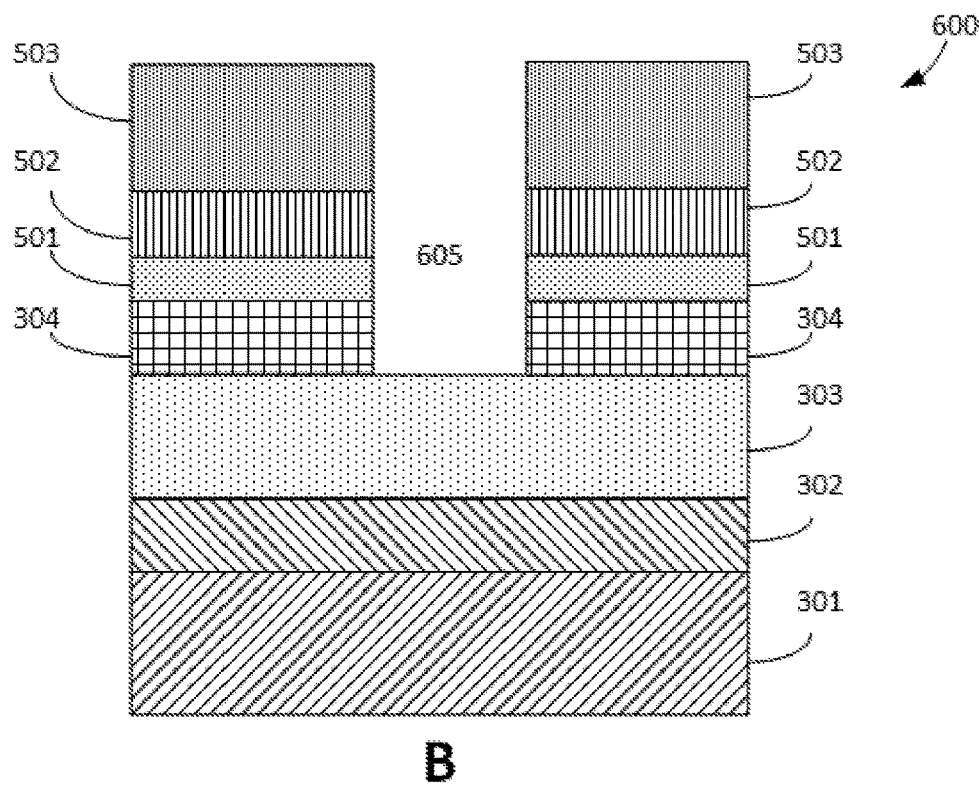
Figure 6B:
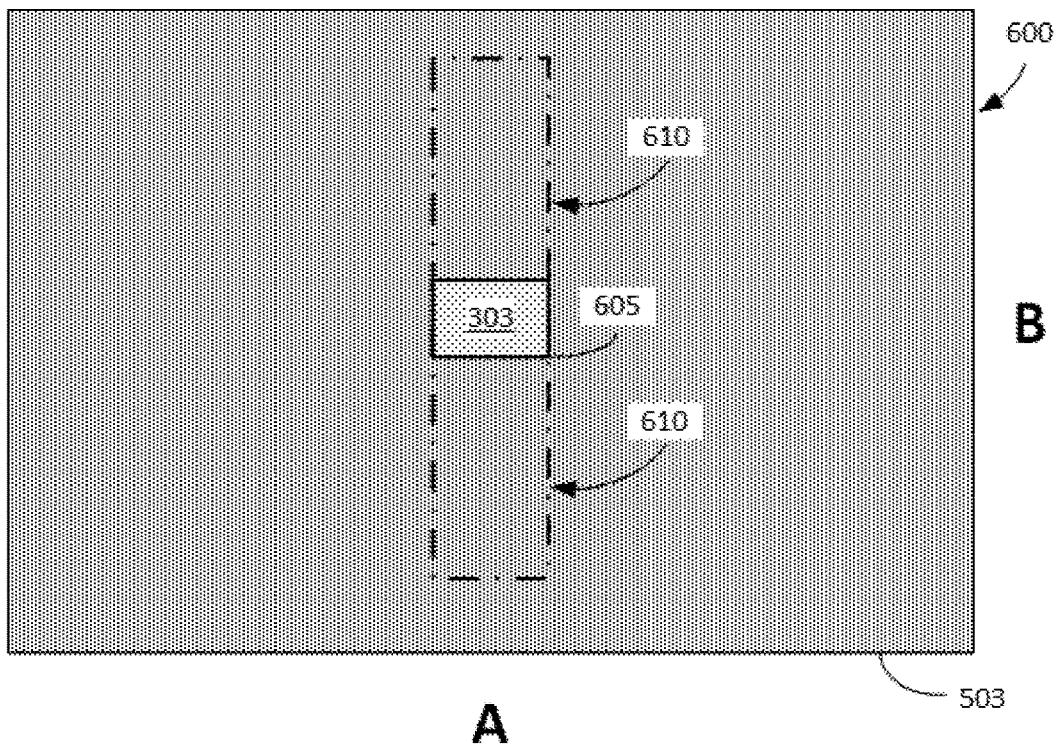

FIG. 6A is a cross-section view of a structure 600 along the cross-section C (shown in FIGS. 5A and 5C) and viewed from perspective B, shown in FIG. 6B. FIG. 6B is a top view of the structure 600 after processing described herein. In some examples, the fabricator applies a litho-etch process (a first exposure of the mandrel structures to lithography) to remove a cut portion of various layers in the structure 600 to form a cut space 605. For example, the fabricator removes a portion of the resist layer 503, SiARC layer 502, OPL layer 501, and etches away a portion of the hardmask layer 304 in order to form the cut space 605. The cut space 605 cuts the initial mandrel structure shown in FIGS. 4A-5B into the cut initial mandrel structure 610, which includes two structures of the layers divided by the cut space 605. In the top view of FIG. 6B, an outline of the cut initial mandrel structure 610 is shown for reference, but the structure is covered by the layers described above, including resist layer 503, except for the cut space 605, which is processed and etched to the mandrel material layer 303. In some examples, the fabricator further processes the structure 600 and the cut initial mandrel structure 610 as described in FIGS. 7A-B.

Figure 7A:
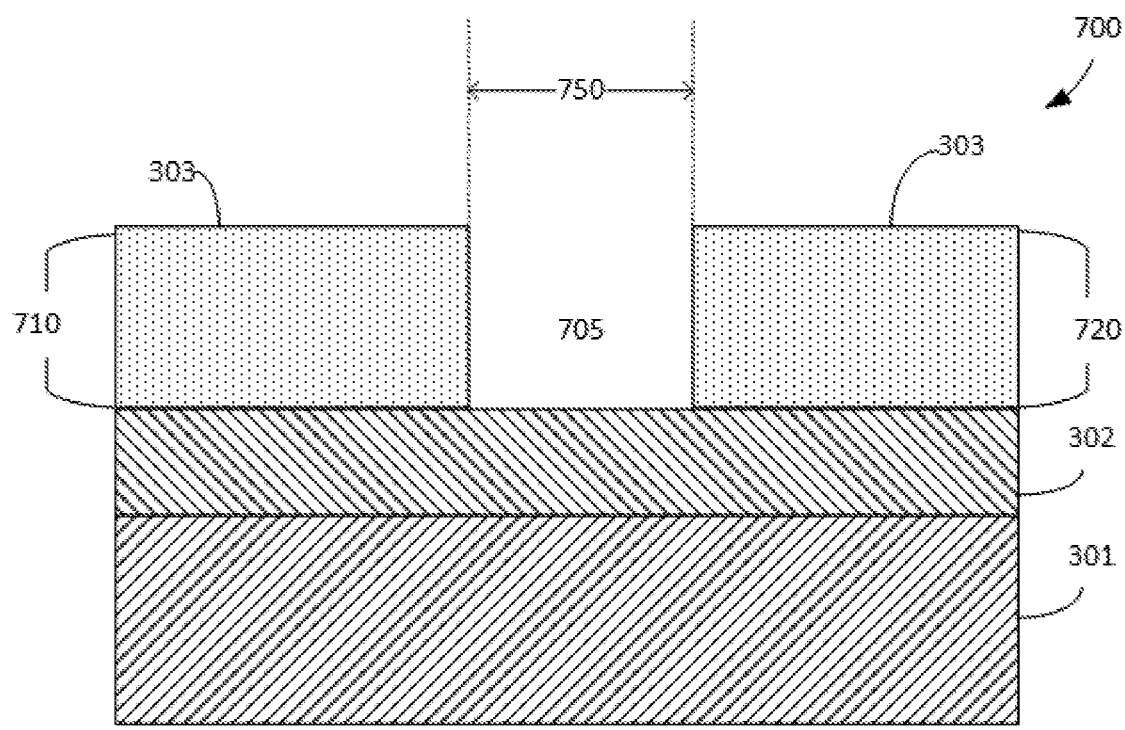
Figure 7B:
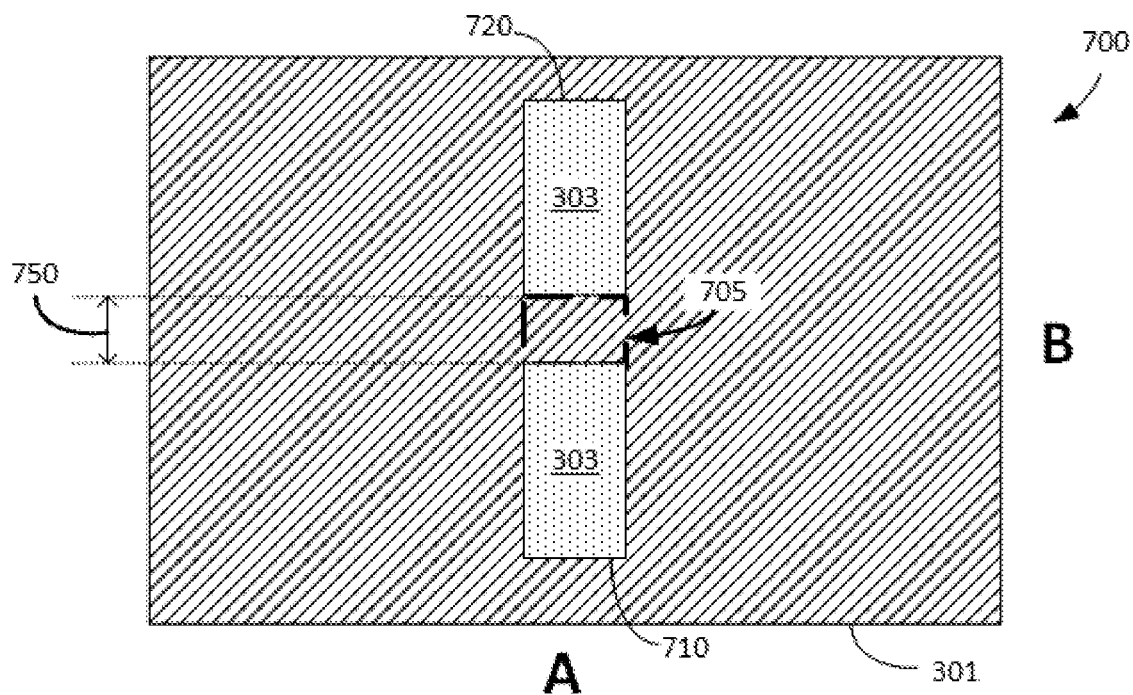

FIG. 7A is a cross-section view of a structure 700 along the cross-section C (shown in FIGS. 5A and 5C) and viewed from perspective B, shown in FIG. 7B. FIG. 7B is a top view of the structure 700 after processing as described herein. In some examples, the fabricator removes a remainder of the OPL layer, the SiARC layer, and the second resist layer to form the first mandrel and the second mandrel. For example, the fabricator removes the remaining portions of the resist layer 503, the SiARC layer 502, the OPL layer 501, and the hardmask layer 304 (shown in FIG. 6A) to form the first mandrel 710 and second mandrel 720 from the cut initial mandrel structure 610 in FIG. 6A. The structure 700 includes a cut space 705 between the first mandrel 710 and the second mandrel 720. The cut space 705 includes a tip-to-tip distance between tips of the mandrels, such as distance 750. In some examples, in order to preserve the distance 750 in the cut space 705, the fabricator uses spacers and a next layer in order to prevent further lithographic exposures from altering the cut space 705 and distance 750. The methods described herein provide improved and efficient SALELE processes that utilize a spin-on-material layer, where the spin-on-material layer fills gaps between spacers to protect line-end to line-end spaces created by the cut space 705 as described in further detail herein.

Returning back to method 200 of FIG. 2, at block 204, the fabricator forms a spacer layer on the first mandrel and the second mandrel, where the spacer layer fills a portion of the cut space. For example, the fabricator forms a spacer layer 830 as described in relation to FIGS. 8A-B.

Figure 8A:
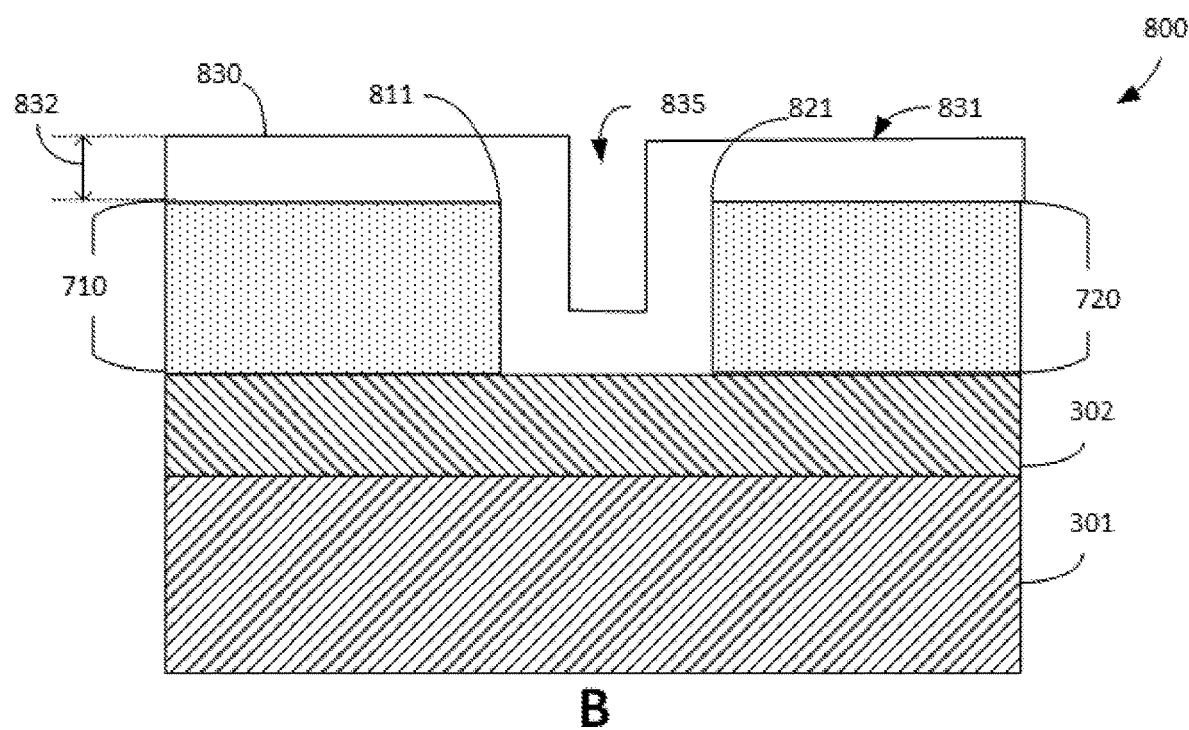
Figure 8B:
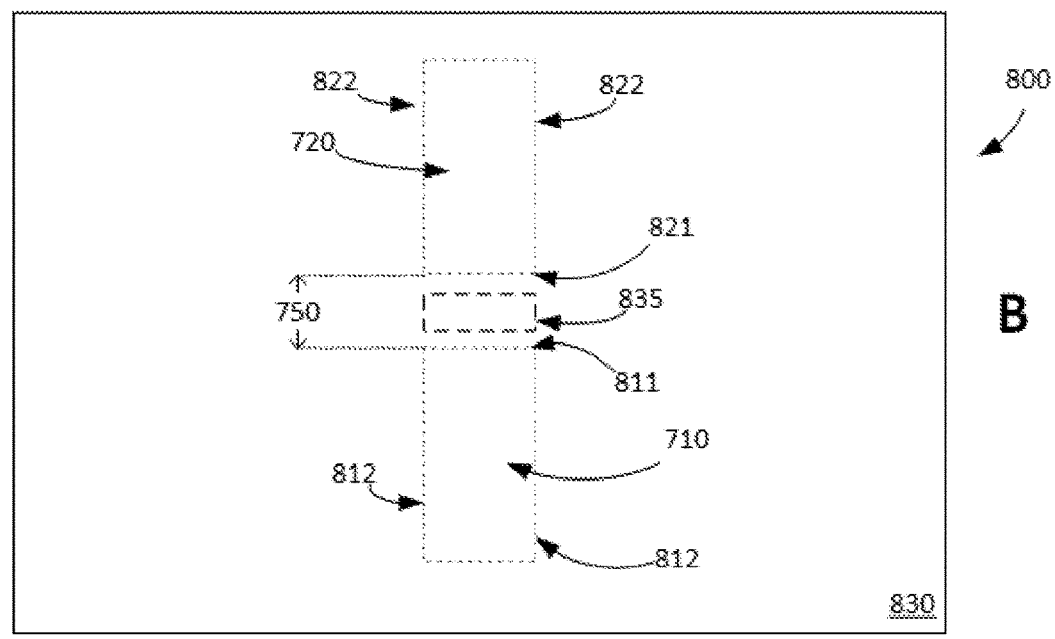

FIG. 8A is a cross-section view of structure 800 along the cross-section C (shown in FIGS. 5A and 5C) and viewed from perspective B, shown in FIG. 8B. FIG. 8B is a top view of the structure 800 after processing as described herein. In the top view of FIG. 8B, outlines of the first mandrel 710 and second mandrel 720 are shown for reference, but the components are covered by the spacer layer 830. In some examples, the fabricator forms the spacer layer 830 on the entire structure 800, including over at least the first mandrel 710 and the second mandrel 720. The fabricator deposits or forms the spacer layer 830 with a thickness 832. In some examples, the thickness 832 of the spacer layer 830 is limited by the material properties of the spacer layer 830 and fabrication techniques for spacer layers.

The fabricator also forms the spacer layer 830 on vertical sidewalls of the mandrels using sidewall depositions process. For example, the fabricator forms the spacer layer on a sidewall 811 of the first mandrel 710 facing the cut space 705 and a sidewall 821 of the second mandrel 720 facing the cut space 705. In some examples, the fabricator also forms the spacer layer 830 on at least two outer sidewalls of the first mandrel 710 and at least two outer sidewalls of the second mandrel 720. For example, the fabricator forms the spacer layer 830 on outer sidewalls 812 of the first mandrel 710 and outer sidewalls 822 of the second mandrel 720.

In some examples, the tip-to-tip distance between the first mandrel 710 and second mandrel 720, i.e., distance 750, is greater than twice the width of thickness 832 of the spacer layer 830. In an example, where the distance 750 is less than twice the thickness 832, the spacer layer 830, including the sidewall portions, may pinch off or otherwise fill the cut space 705 during spacer deposition. However, when the distance 750 is greater than twice a thickness of the spacer layer 830, as shown in the structure 800, the spacer layer 830 fills only a portion of the cut space less than a total volume of the cut space, which leaves a remaining portion or gap 835 in the cut space 705. In some examples, the gap 835 extends to a top 831 of the spacer layer 830. In order to further protect the cut space 705 in later lithograph exposures and to preserve line-end spaces spin on material use to fill the gap 835 as described herein.

Returning back to method 200 of FIG. 2, at block 206, the fabricator forms a next layer on the spacer layer to fill a remaining portion of the cut space. For example, the fabricator forms a next or spin-on-glass (SOG) layer as described in relation to FIGS. 9A-D. While discussed herein with reference to a SOG layer, other polymers or inorganic or other spin-on-materials may also be used to form the polymer layer on the spacer layer 830.

Figure 9A:
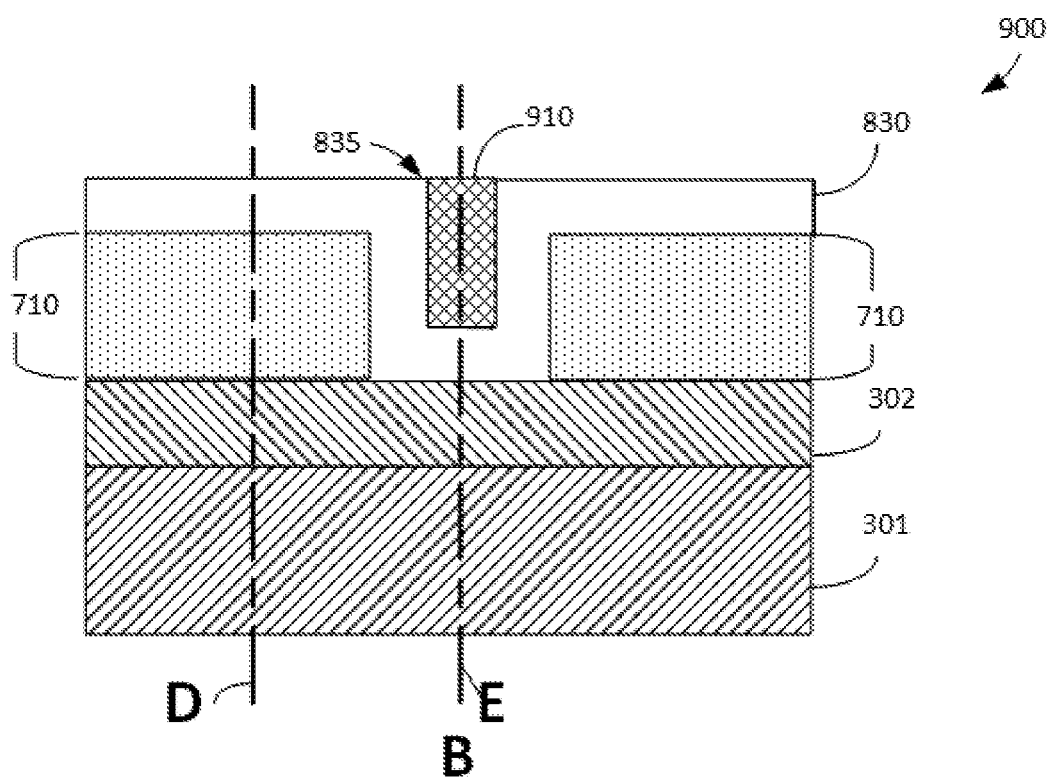
Figure 9B:
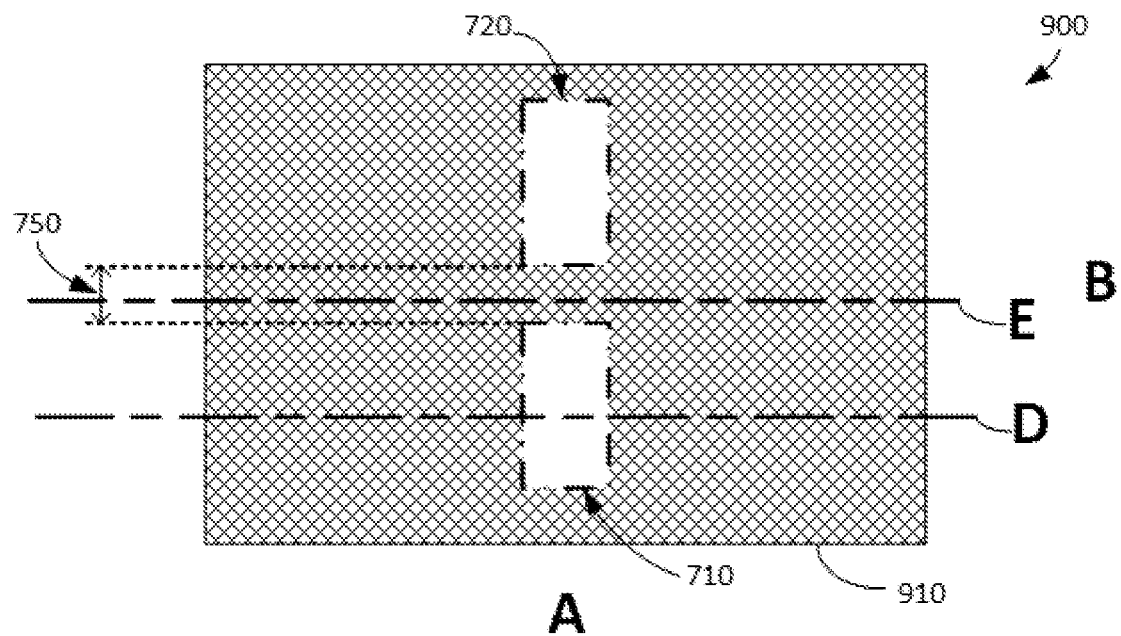
Figure 9C:
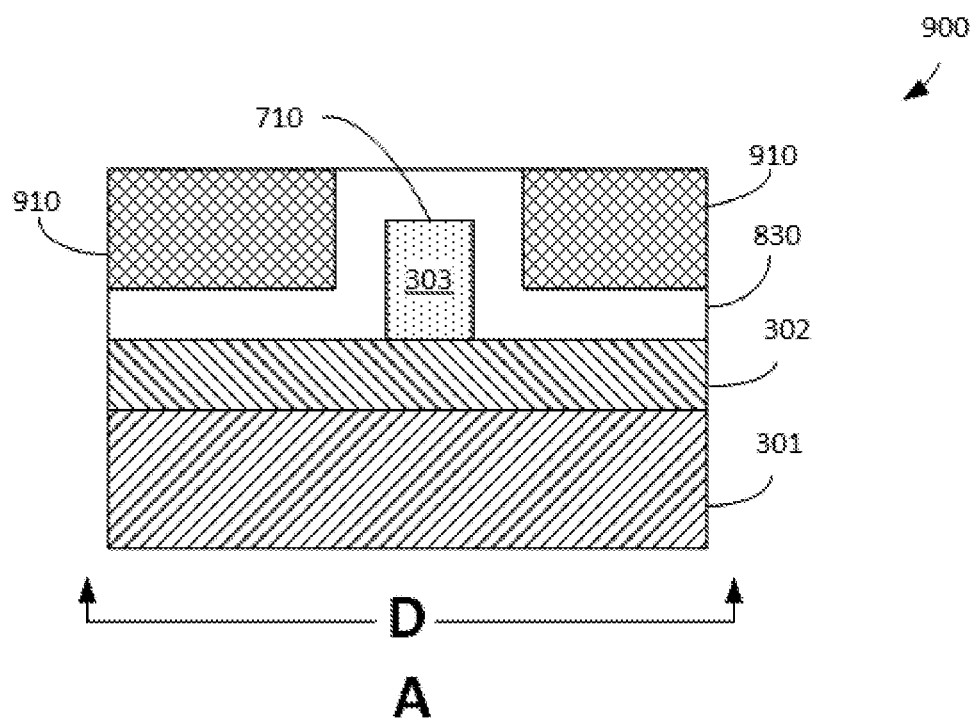
Figure 9D:
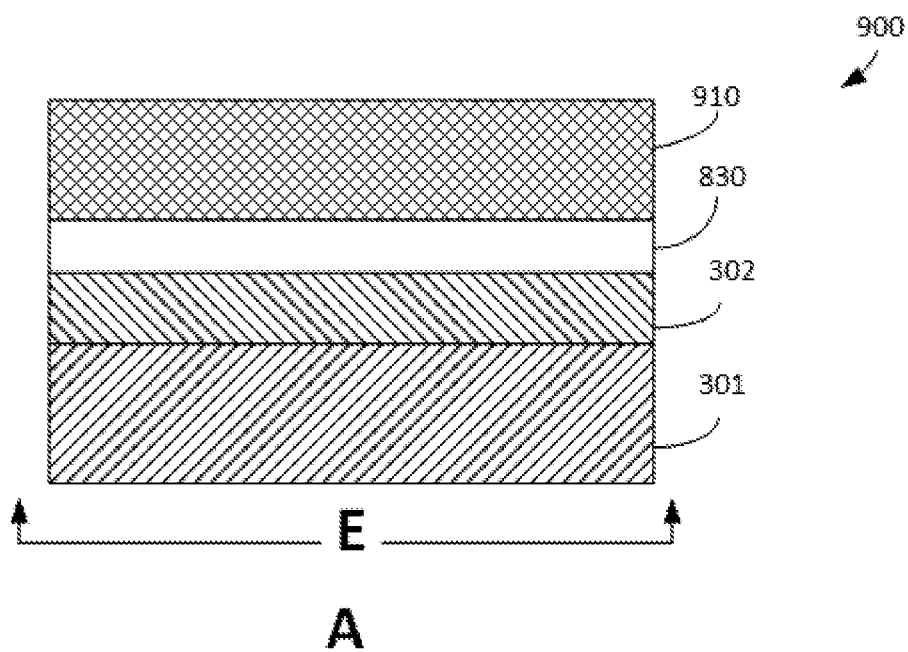

FIG. 9A is a cross-section view of structure 900 along the cross-section C (shown in FIGS. 5A and 5C) and viewed from perspective B, shown in FIG. 9B. FIG. 9B is a top view of the structure 900 after processing as described herein. The top view of FIG. 9B includes outlines of the first mandrel 710 and second mandrel 720 for reference, but the mandrels themselves are covered by the spacer layer 830. FIG. 9C is cross-section view of structure 900 along the cross-section D and viewed from perspective A, shown in FIG. 9B. FIG. 9D is cross-section view of structure 900 along the cross-section E and viewed from perspective A, shown in FIG. 9B.

In some examples, the fabricator forms the SOG layer 910 on the entire structure 900, including over at least the spacer layer 830 (including portions of the spacer layer 830 formed over the first mandrel 710 and second mandrel 720). The fabricator also forms the SOG layer 910 over the spacer layer 830 in other portions of the structure 900 including filling in the gap 835 in the cut space 705 as shown in FIGS. 9A and 9D. The fabricator also forms the SOG layer 910 on spacer layer 830 on each side of the mandrels. For example, as shown in FIG. 9C, the SOG layer 910 is formed on each side of the first mandrel 710 and the surrounding spacer layer 830.

In some examples, the fabricator also etches the SOG layer 910 back such that the spacer layer 830 covering first mandrel 710 and second mandrel 720 is not covered by the spacer layer (as shown in FIG. 9B and the cross section E in FIG. 9D). For example, when the SOG layer 910 is deposited on the structure 900, some portions of the SOG layer 910 may incidentally over cover areas that do not need spin-on-material. These areas are etched by the fabricator to expose at least the spacer layer formed above the first mandrel 710 and second mandrel 720.

Returning back to method 200 of FIG. 2, at block 208, the fabricator forms a third or final resist layer with a first CD in a first cross-section and a second CD in a second cross-section to form a final resist stack. For example, the fabricator forms and patterns a resist layer 1010 as described in FIGS. 10A-11D.

Figure 10A:
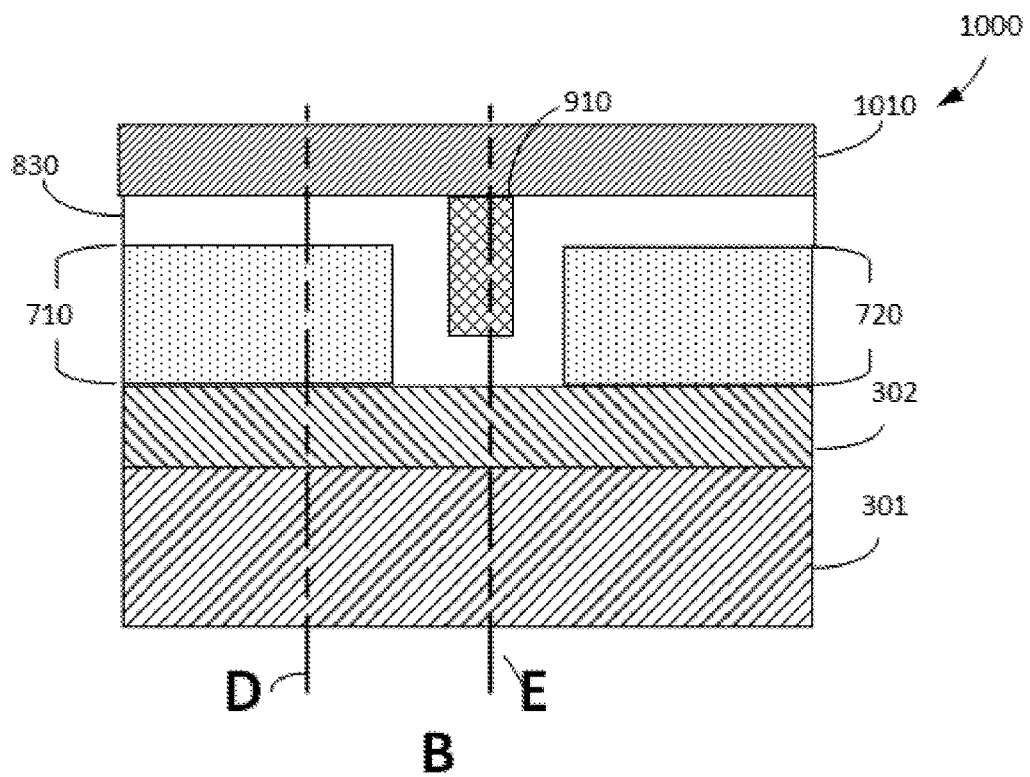
Figure 10B:
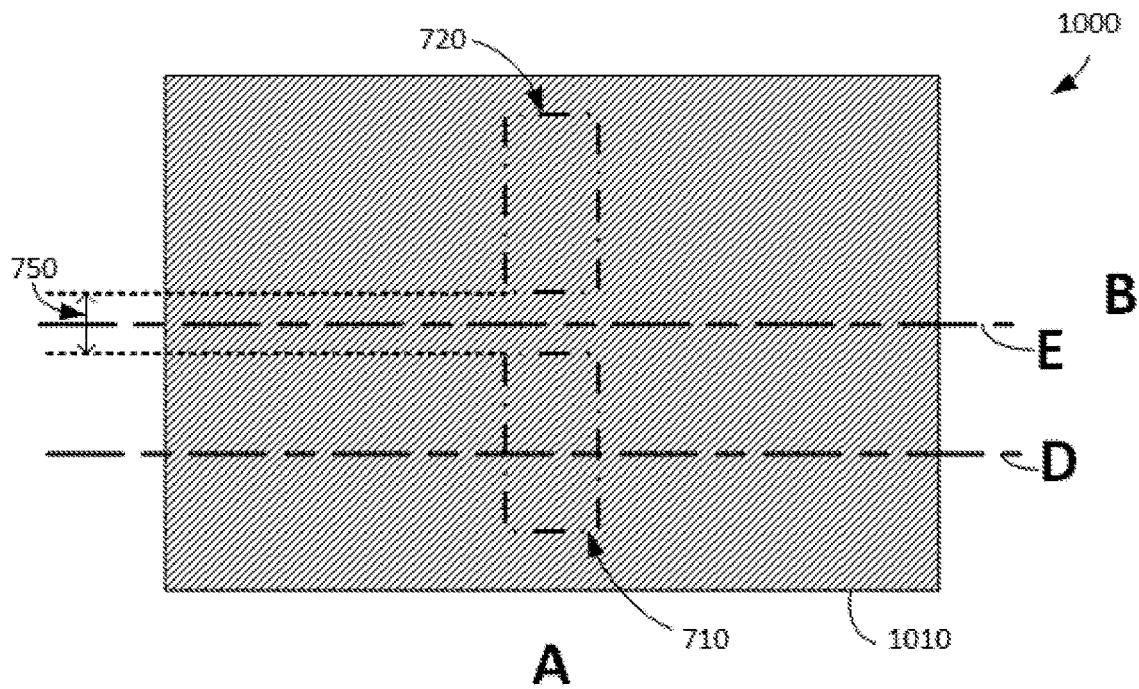
Figure 10C:
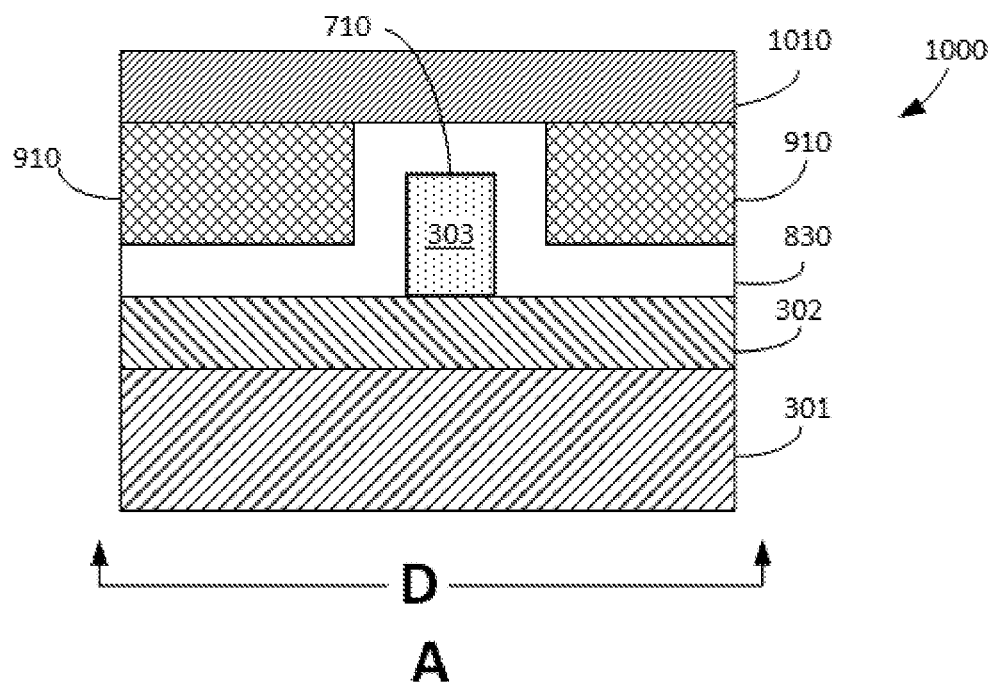
Figure 10D:
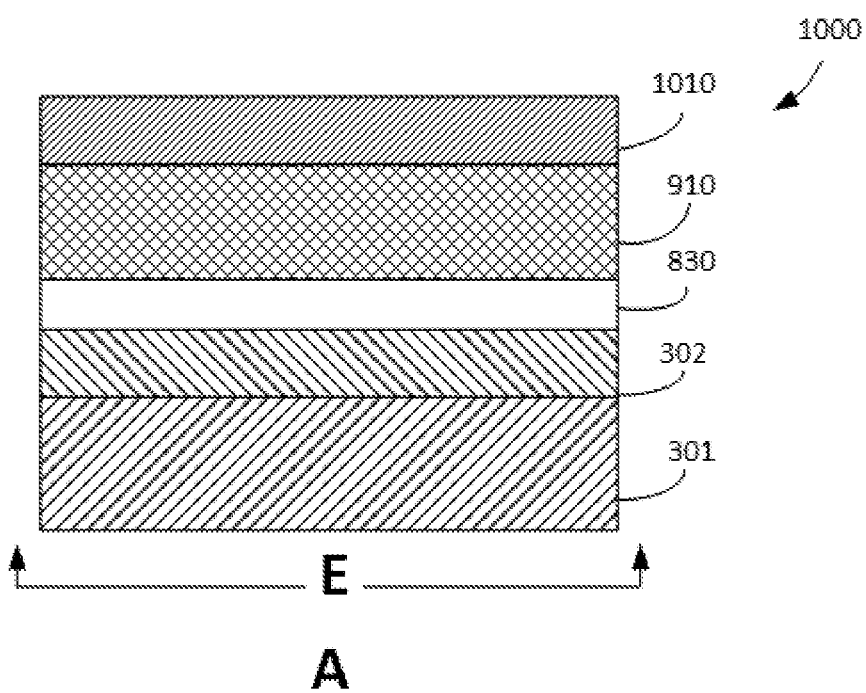

FIG. 10A is a cross-section view of structure 1000 along the cross-section C (shown in FIGS. 5A and 5C) and viewed from perspective B, shown in FIG. 10B. FIG. 10B is a top view of the structure 1000 after processing as described herein. The top view of FIG. 10B includes outlines of the first mandrel 710 and second mandrel 720 for reference, but the mandrels are covered by the resist layer 1010 (among other layers). FIG. 10C is cross-section view of structure 1000 along the cross-section D and viewed from perspective A, shown in FIG. 10B. FIG. 10D is cross-section view of structure 1000 along the cross-section E and viewed from perspective A, shown in FIG. 10B.

In some examples, the fabricator forms the resist layer 1010 on the entire structure 1000, including over at least the spacer layer 830 (including portions of the spacer layer 830 formed over the first mandrel 710 and second mandrel 720) and the SOG layer 910. In some examples, the resist layer 1010 is a resist layer with a BARC.

As shown in FIG. 10B, the cross-section D through structure 1000 includes a cross-section of the first mandrel 710, where FIG. 10C illustrates the spacer layer 830 formed on and over the mandrel material layer 303 in the first mandrel 710. The cross-section D in FIG. 10C also illustrates the SOG layer 910 formed on the spacer layer 830 and the resist layer 1010 formed on the SOG layer 910 and spacer layer 830.

FIG. 10D illustrates the cross-section E through structure 1000 which includes the cross-section of the cut space 705 shown in FIG. 7A, where the cut space 705 is filled with the spacer layer 830 formed in the cut space, and the SOG layer 910 formed in the gap 835, shown in FIG. 8A. FIG. 10D illustrates the spacer layer 830 formed on and over the hardmask layer 302, the SOG layer 910 formed on the spacer layer 830, and the resist layer 1010 formed on the SOG layer 910.

When the structure 1000 is formed into a resist stack including all of the layers of the structure 1000 shown in FIGS. 10A-D, the fabricator patterns additional features into the resist layer 1010 as described in relation to FIGS. 11A-11D.

Figure 11A:
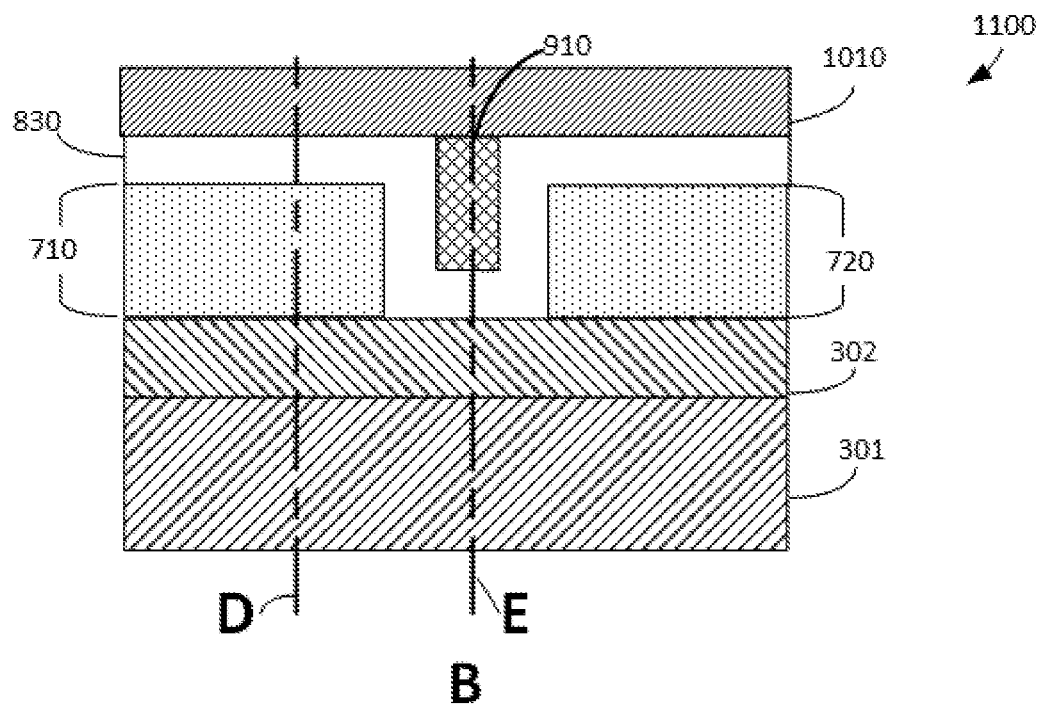
Figure 11B:
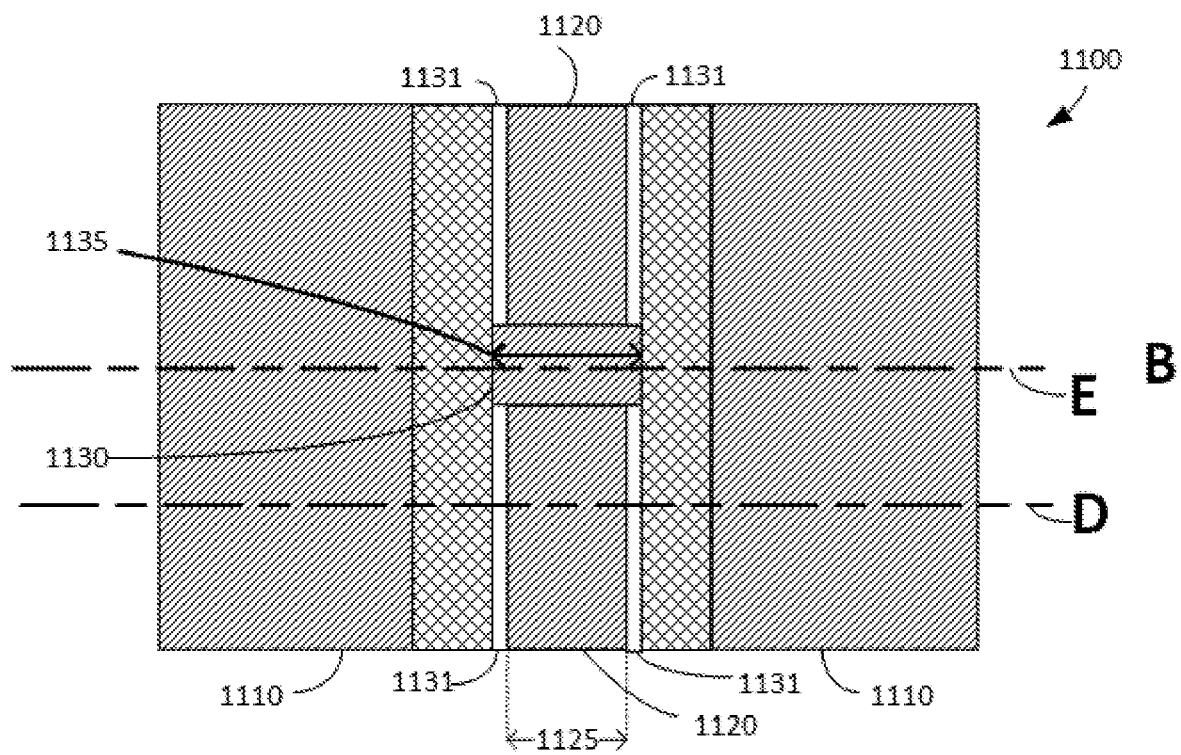
Figure 11C:
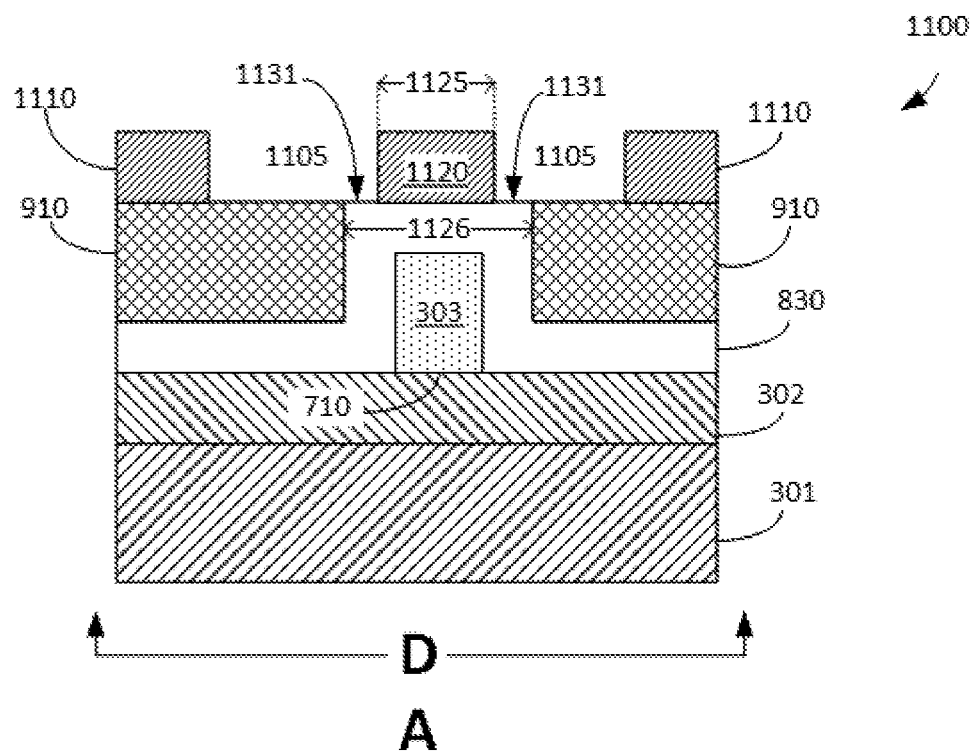
Figure 11D:
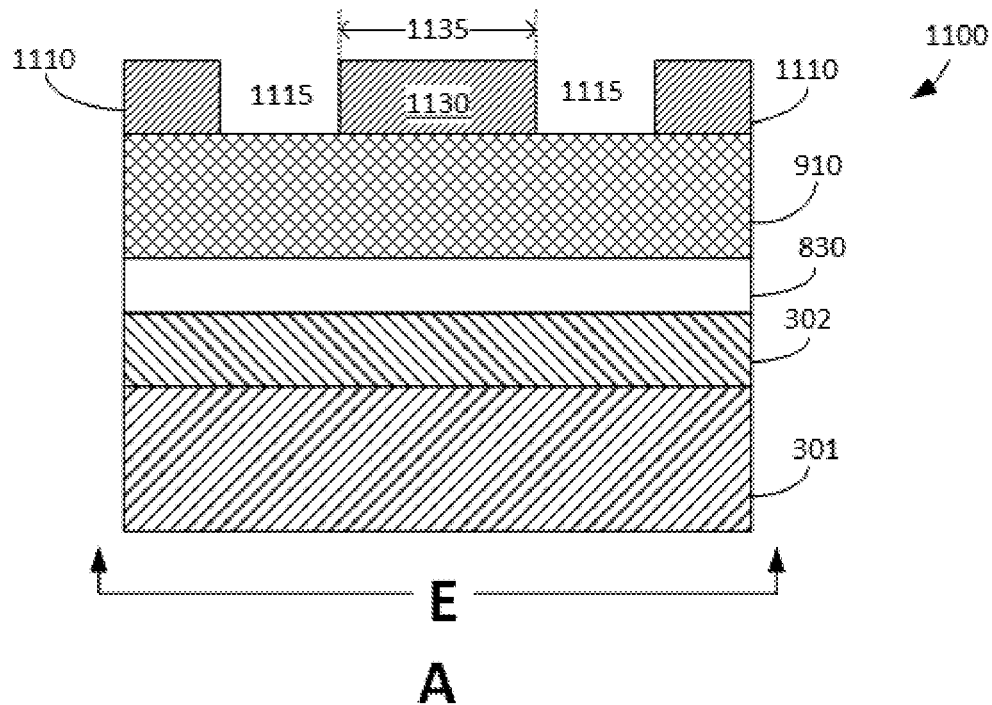

FIG. 11A is a cross-section view of structure 1100 along the cross-section C (shown in FIGS. 5A and 5C) and viewed from perspective B, shown in FIG. 11B. FIG. 11B is a top view of the structure 1100 after processing as described herein. FIG. 11C is cross-section view of structure 1100 along the cross-section D and viewed from perspective A, shown in FIG. 11B. FIG. 11D is cross-section view of structure 1100 along the cross-section E and viewed from perspective A, shown in FIG. 11B.

FIG. 11A, illustrates first mandrel 710 and second mandrel 720 within the structure 1100. In some examples, the cross-section C of the structure 1100 has not changed from the cross-section C shown in FIG. 10A. The fabricator removes portions of the final resist layer to form the first and second patterned resist sections in the final resist layer and first and second voids in removed portions of the final resist layer. In some examples, the fabricator patterns and processes the resist layer 1010 to remove portions of the resist layer forming resist sections or patterns 1110, 1120, and 1130 on the resist layer 1010 and voids 1105. The patterns 1120, shown in FIG. 11B and the cross-section D in FIG. 11C are formed on a portion of the resist layer 1010 covering the first mandrel 710 and the second mandrel 720. For example, as shown in FIG. 11C, the pattern 1120 is formed in the layer 1010 that is positioned on the spacer layer 830 above the first mandrel 710.

The pattern 1120 has an associated CD 1125. In some examples, the CD 1125 is equal to or wider than a CD or width of the first mandrel 710 and 720 in a same direction. In some examples, the CD 1125 is less than width 1126 which is a width of the of the spacer layer 830 (e.g., thickness 832) formed over the first mandrel 710 and second mandrel 720 and the mandrel width. For example, as shown in FIGS. 11B and 11C, the CD 1125 is less than width 1126 such that portions of the spacer layer 830 are exposed in the void 1105. In some examples, the portions of the spacer layer 830 are sidewall spacers 1131 which includes the portions of the spacer layer 830 formed on outer sidewalls of the first mandrel 710 and second mandrel 720.

The voids 1105 includes the removed resist layer on each side of the patterns 1120 and form a void between the patterns 1120 and 1110. In some examples, not shown in FIGS. 11A-D, the structures 1100 may correspond to additional features such as resist layers formed over additional mandrels in the structure 1100 (and other related layers such as spacer layers etc.).

The fabricator also patterns and processes the resist layer 1010 to remove portions of the resist layer forming pattern 1130 on the resist layer 1010 and voids 1115. The pattern 1130, shown in FIG. 11B and the cross-section E in FIG. 11D is formed on a portion of the resist layer 1010 covering the cut space 705, shown in FIG. 7. For example, as shown in FIG. 11D, the pattern 1120 is formed in the layer 1010 that is positioned on cut space 705 such that the cross-section E does not pass through the first mandrel 710 and second mandrel 720. In some examples, the pattern 1130 has an associated CD 1135, where the CD 1135 is wider than the CD 1125. That is, the CD 1125 is less than a width of the first mandrel 710 and the spacer layer 830 in cross-section D, and CD 1135 in cross-section E is equal to twice the thickness 832 of the spacer layer 830 and the width of the first mandrel 710. For example, the CD 1135 is twice the thickness 832 plus the mandrel width (e.g., width 1126). The CD 1135 in the pattern 1130 as well as the CD 1125 and the sidewall spacers 1131 preserves material below the respective patterns and in turn preserves the cut space 705 the line-end to line end opening during further processing described herein. The CD 1135, CD 1125, and the sidewall spacers 1131 also preserver a line width for metal lines during further processing described herein.

Returning back to method 200 of FIG. 2, at block 210, the fabricator processes the final resist stack to expose a first hardmask, where the first hardmask forms a pattern for metal line structures with preserved line-end to line-end spaces corresponding to the cut space. In some examples, the fabricator processes the final resist stack, or structure 1100 according the standing processes described in relation to FIGS. 12A-15D FIG. 12A is a cross-section view of structure 1200 along the cross-section C (shown in FIGS. 5A and 5C) and viewed from perspective B, shown in FIG. 12B. FIG. 12C is cross-section view of structure 1200 along the cross-section D and viewed from perspective A, shown in FIG. 12B. FIG. 12D is cross-section view of structure 1200 along the cross-section E and viewed from perspective A, shown in FIG. 12B.

Figure 12A:
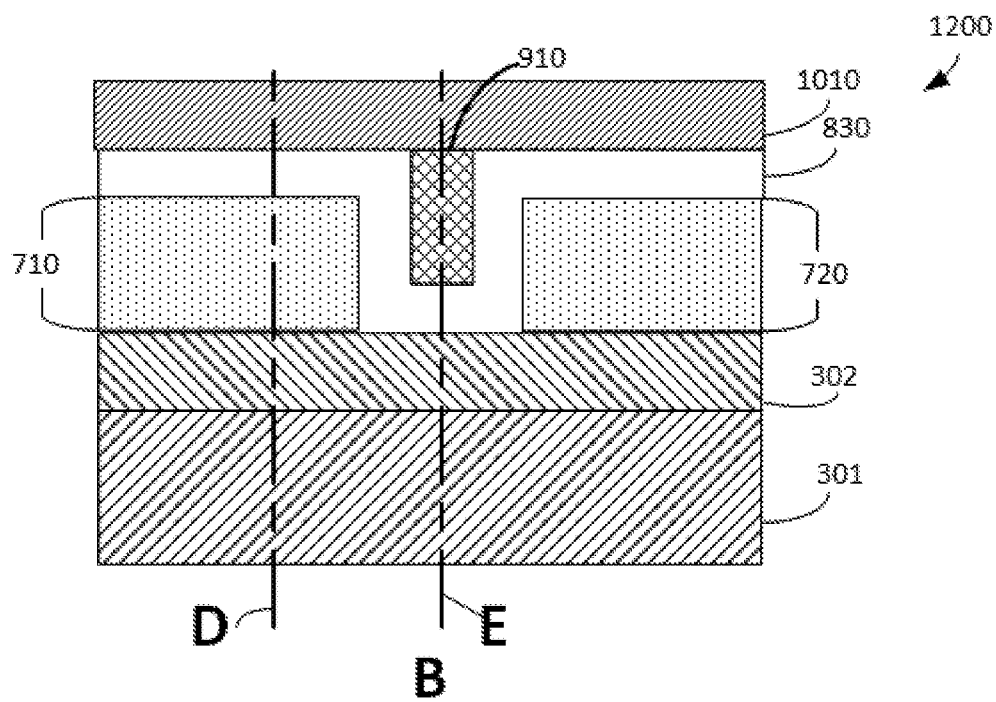
Figure 12B:
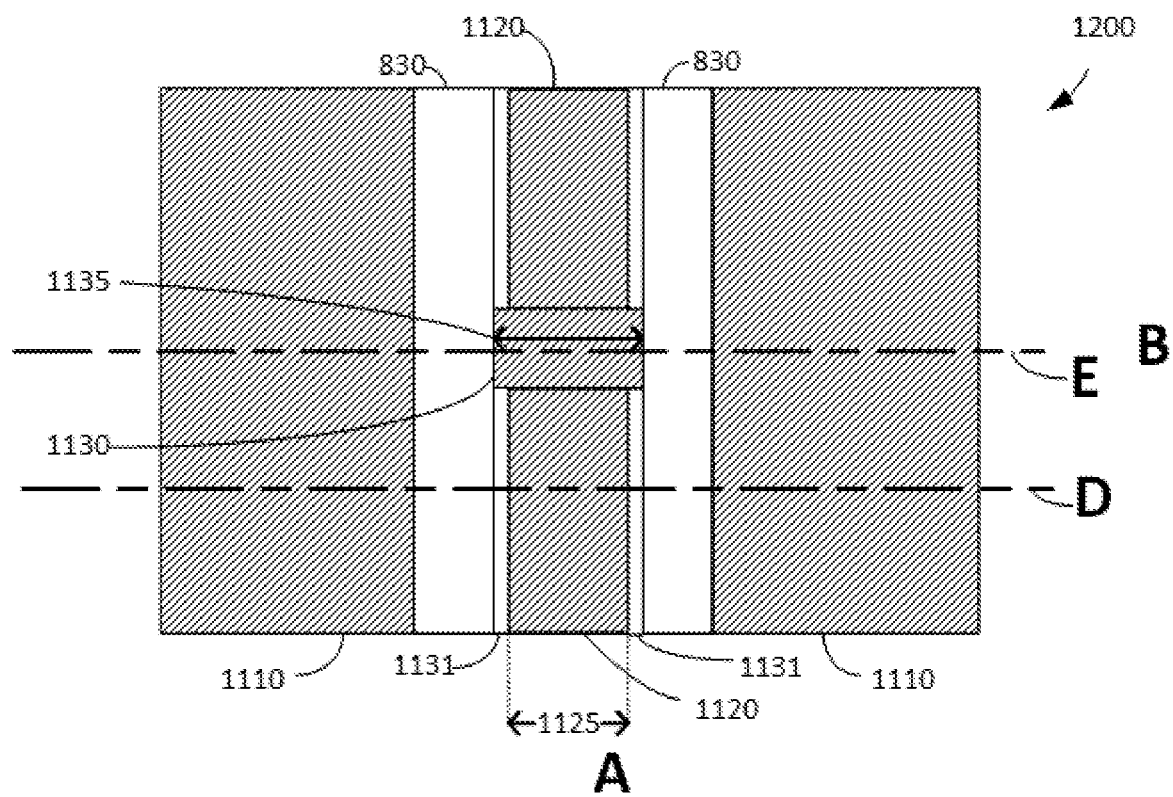
Figure 12C:
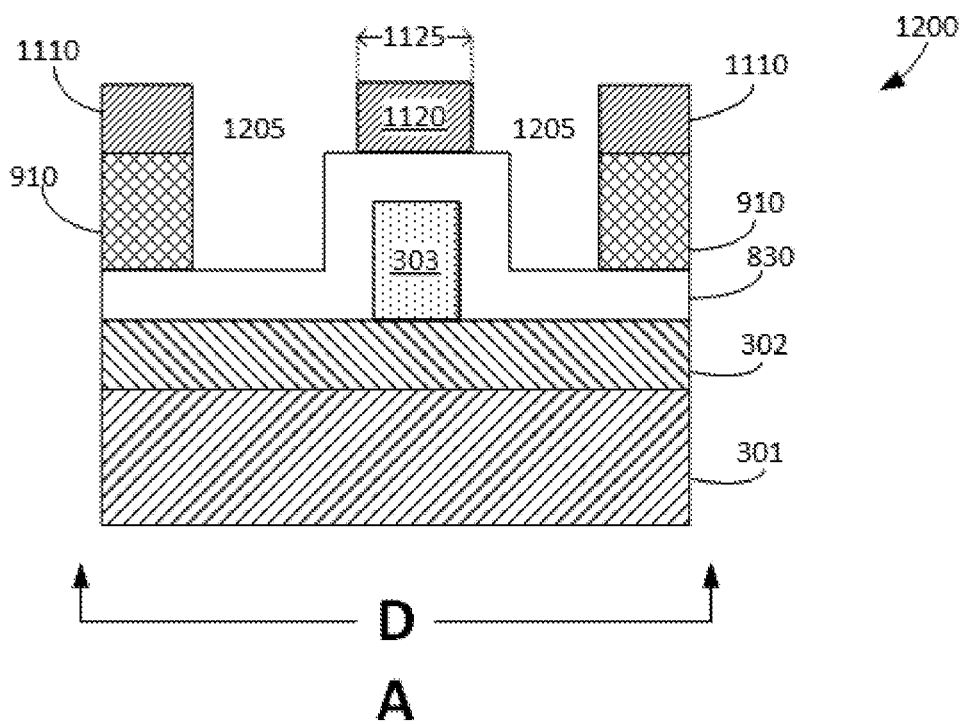
Figure 12D:
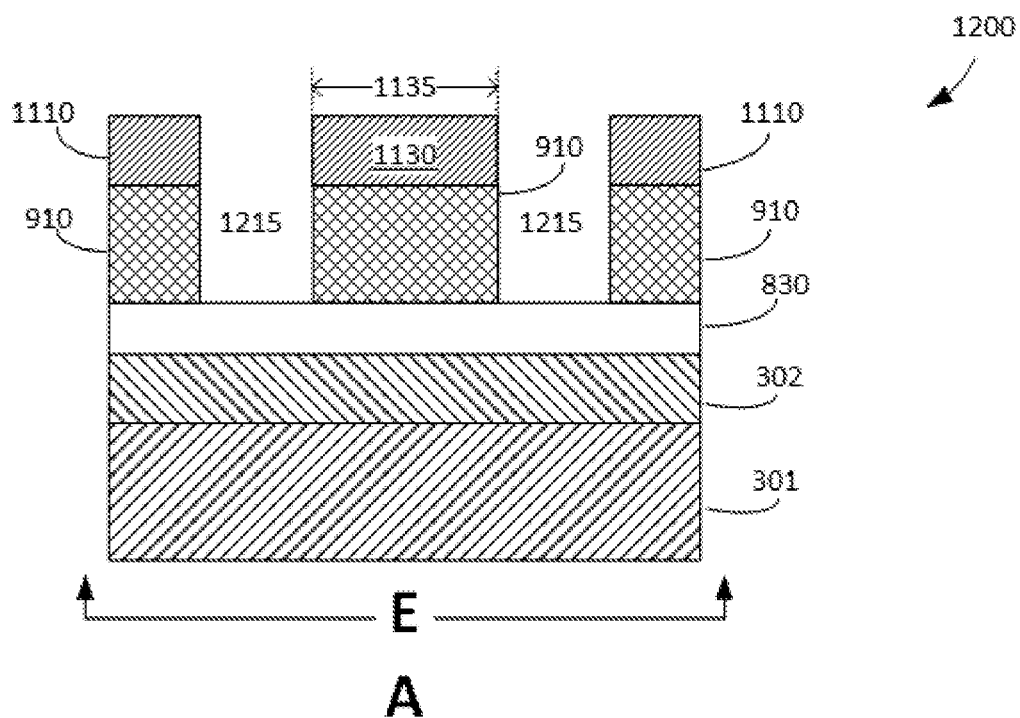

FIG. 12A, illustrates first mandrel 710 and second mandrel 720 within the structure 1200. In some examples, the cross-section C of the structure 1200 has not changed from the cross-section C shown in FIG. 11A. In some examples, the fabricator etches a portion of the SOG layer 910 exposed in the voids 1105 and 1115 to expose portions of the spacer layer 830 and forming respective voids 1205 and 1215. The fabricator also removes the resist layer 1010 to form the structure 1300 in FIGS. 13A-D.

Figure 13A:
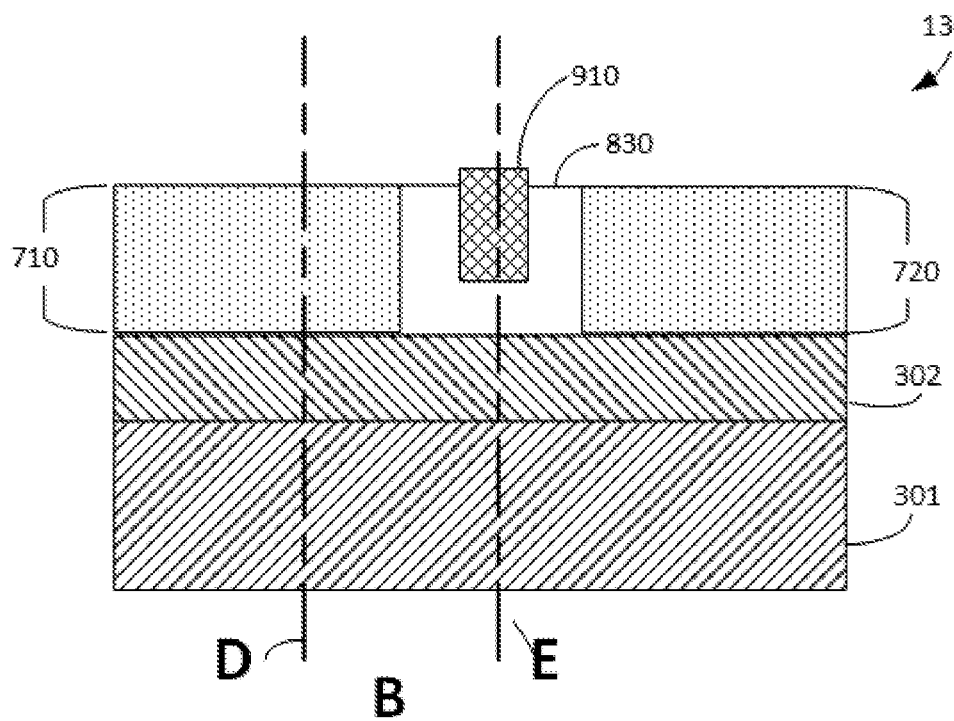
Figure 13B:
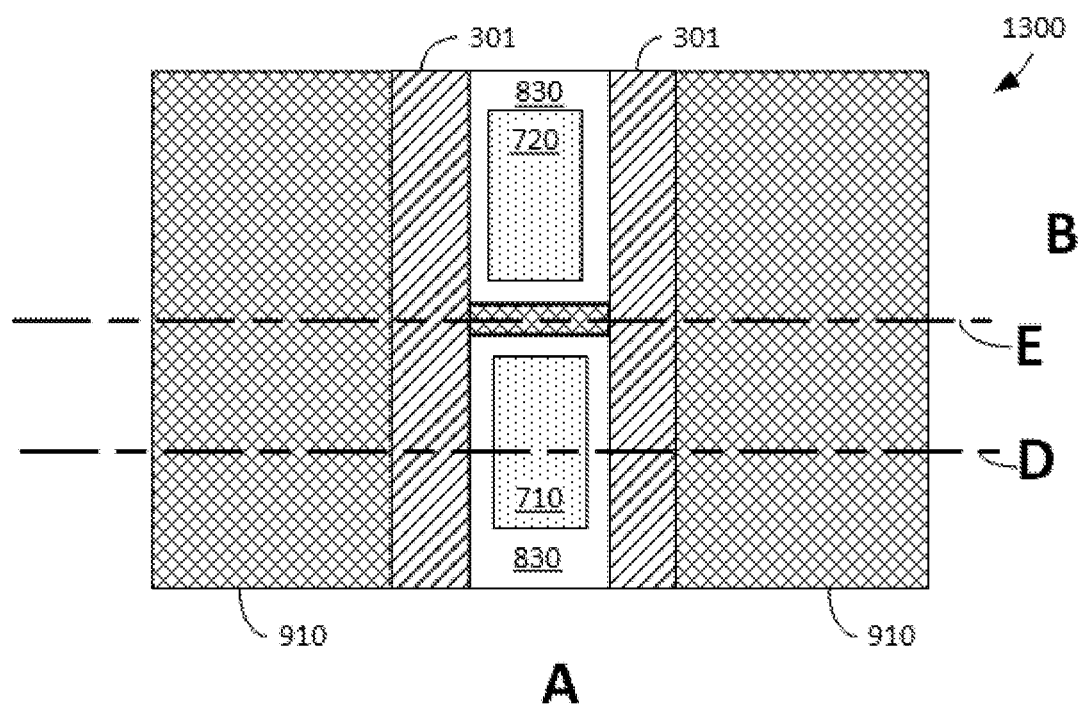
Figure 13C:
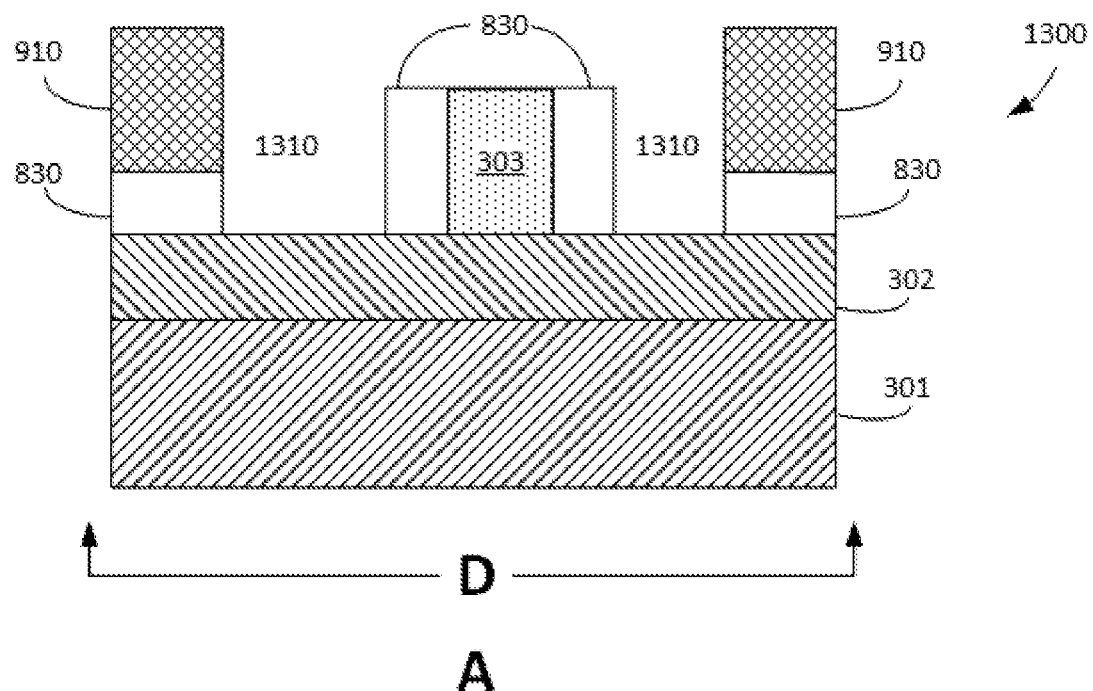
Figure 13D:
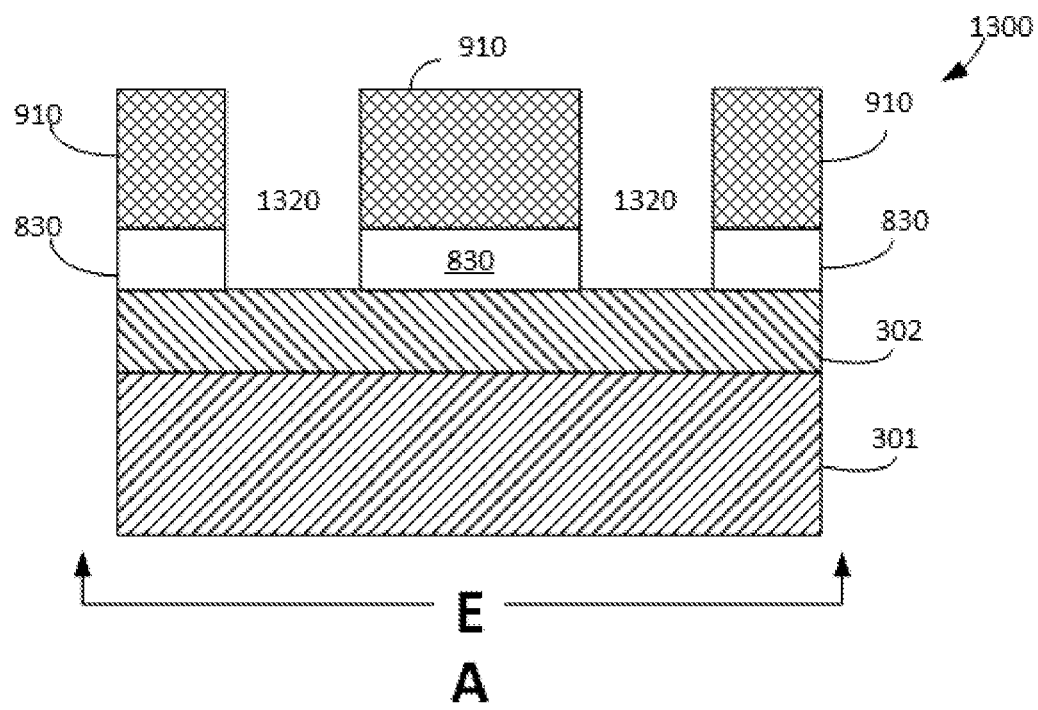
Figure 14A:
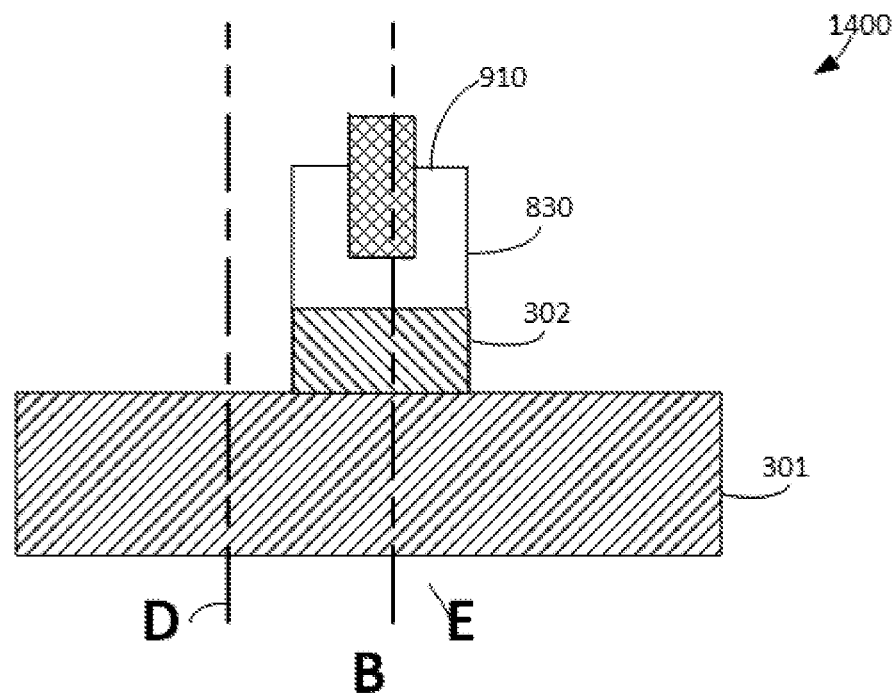
Figure 14B:
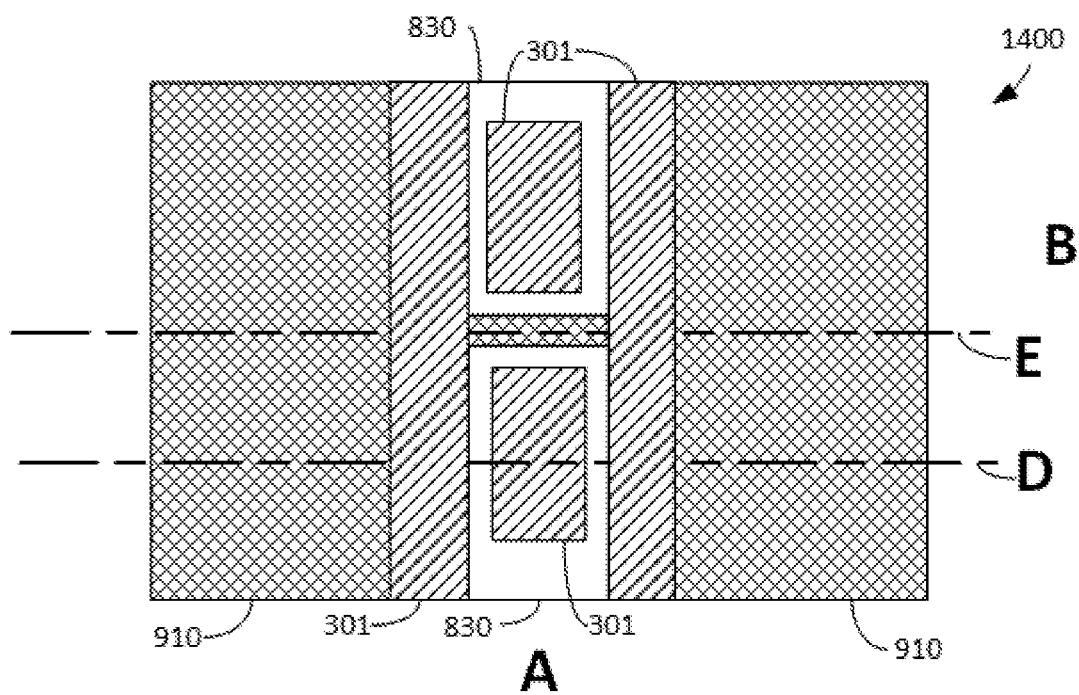
Figure 14C:
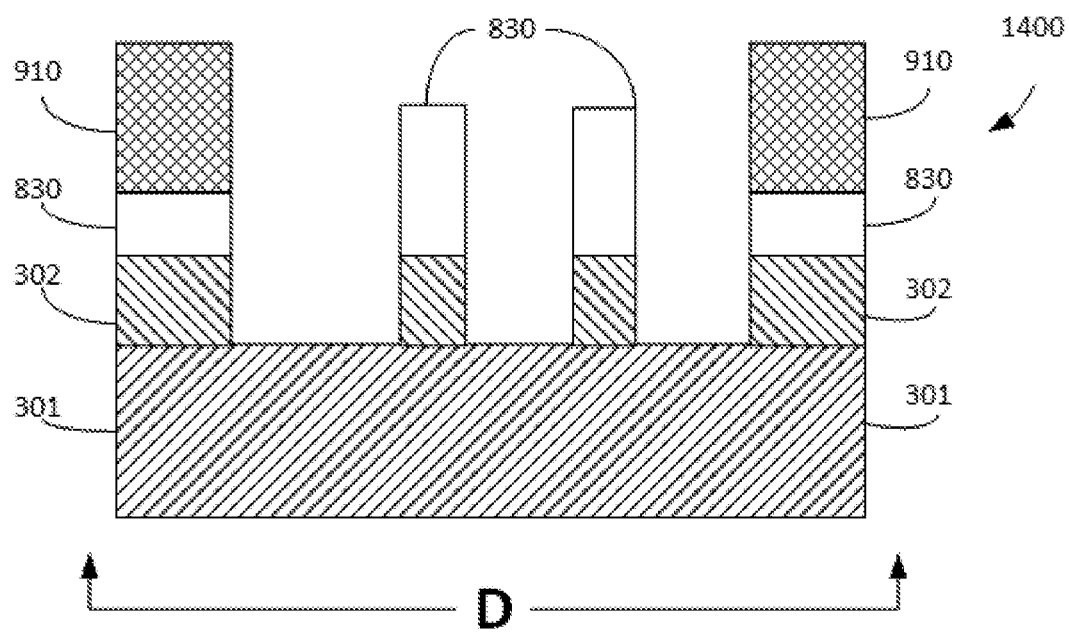
Figure 14D:
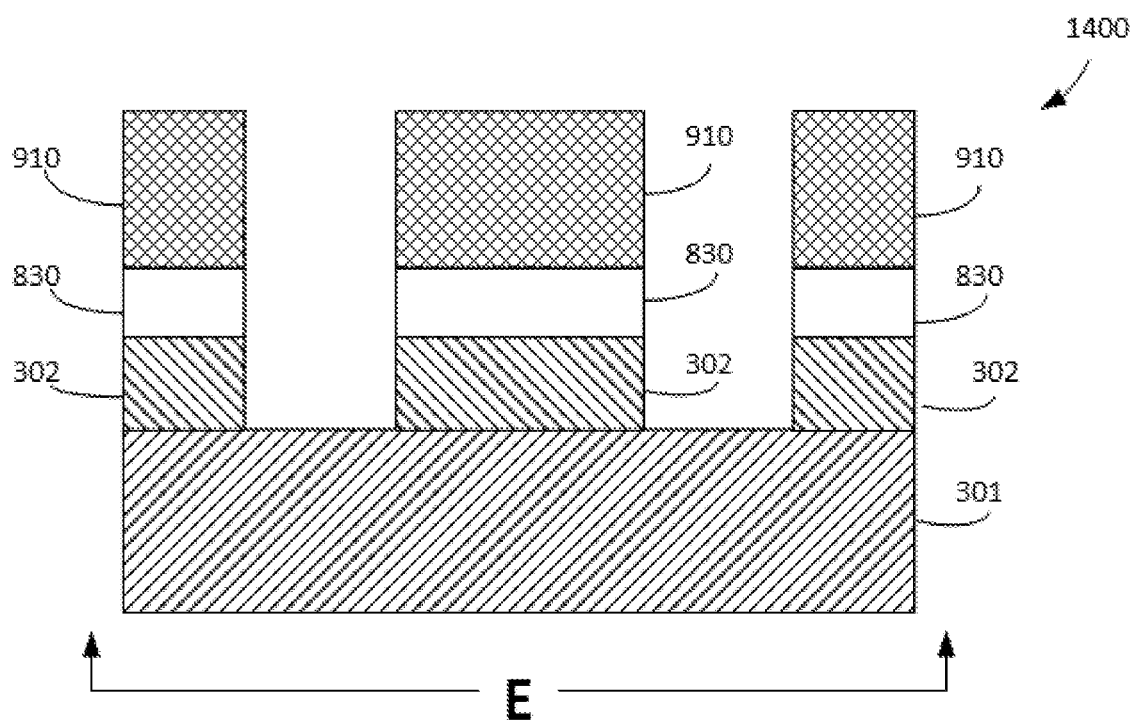
Figure 15A:
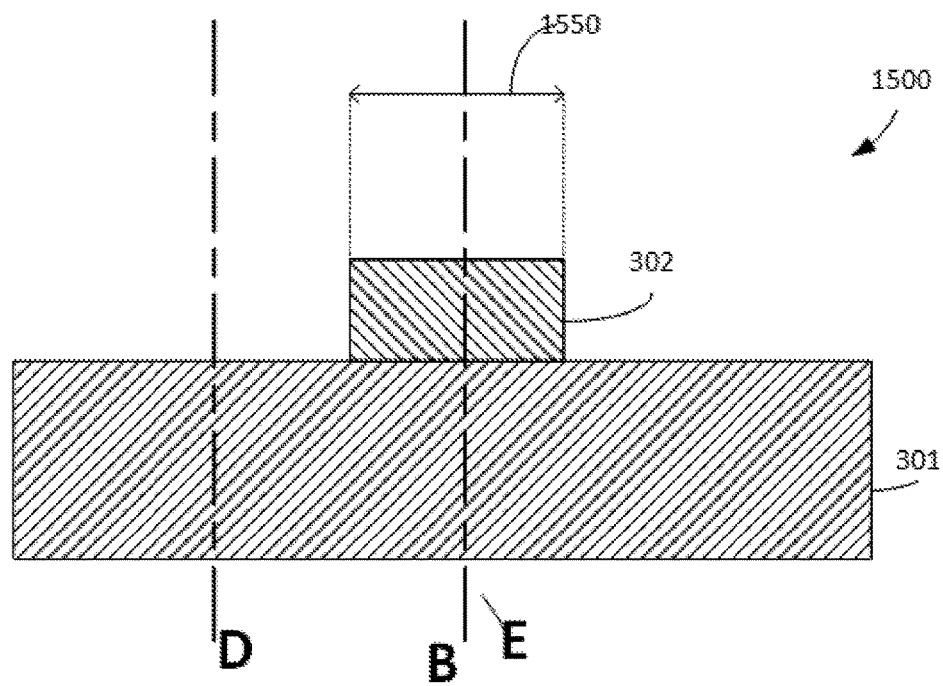
Figure 15B:
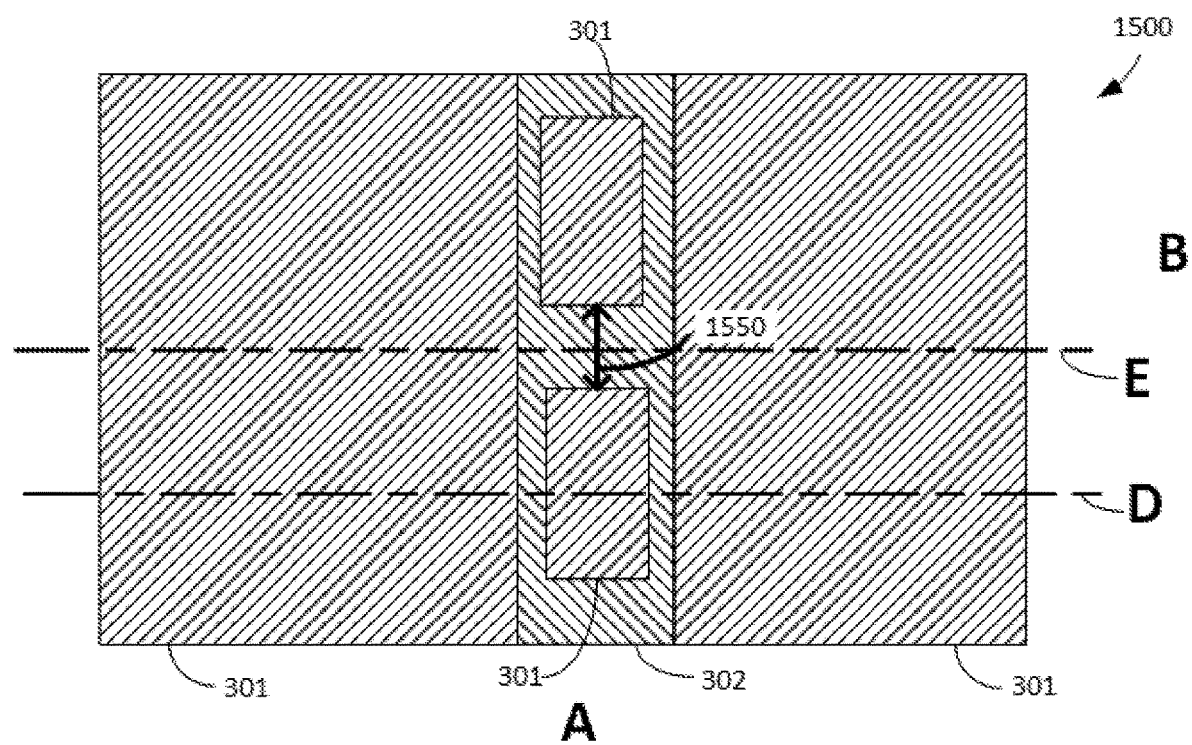
Figure 15C:
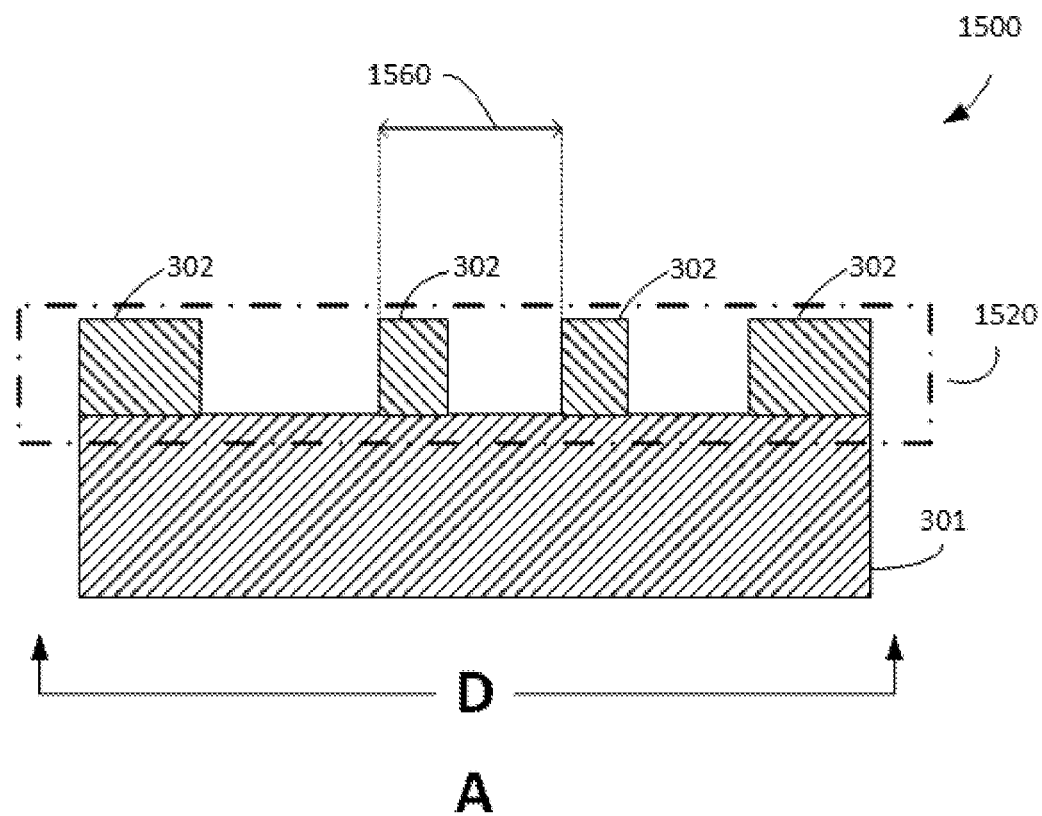
Figure 15D:
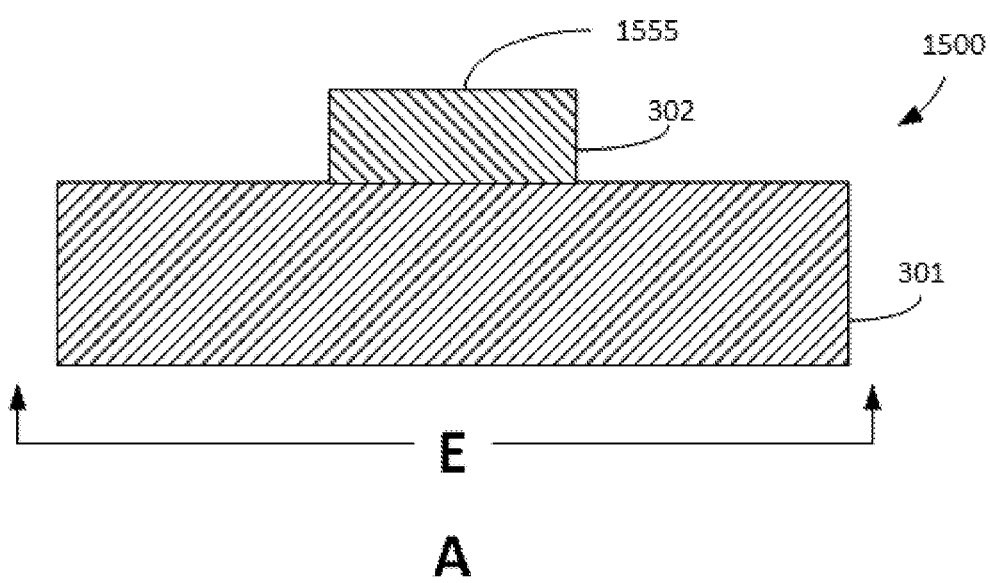

FIG. 13A is a cross-section view of structure 1300 along the cross-section C (shown in FIGS. 5A and 5C) and viewed from perspective B, shown in FIG. 13B. FIG. 13C is cross-section view of structure 1300 along the cross-section D and viewed from perspective A, shown in FIG. 13B. FIG. 13D is cross-section view of structure 1300 along the cross-section E and viewed from perspective A, shown in FIG. 13B. FIG. 14A is a cross-section view of structure 1400 along the cross-section C (shown in FIGS. 5A and 5C) and viewed from perspective B, shown in FIG. 14B. FIG. 14C is cross-section view of structure 1400 along the cross-section D and viewed from perspective A, shown in FIG. 14B. FIG. 14D is cross-section view of structure 1400 along the cross-section E and viewed from perspective A, shown in FIG. 14B.

To further process the structure 1200 in order to form a pattern for metal line structures, the fabricator also etches exposed portions of the spacer layer 830 to expose the hardmask layer 302 and form the voids 1310 and 1320 shown in FIGS. 13C and 13D.

The fabricator also removes the first mandrel 710 and the second mandrel 720 as shown in FIGS. 14A-D and etches exposed portions of the first hardmask layer to expose the substrate 301 as shown in the structure 1400 in FIGS. 14A-D.

The fabricator also removes remaining portions of the SOG layer 910 and removes the remaining portions of the spacer layer 830 to expose a pattern for metal line structures in remaining portions of the first hardmask layer. For example, the various remaining overlying layers are removed from the structure 1500 in FIGS. 15A-D. The structure 1500 includes a pattern 1520 for forming metal lines in a BEOL process. The pattern 1520 provides a line-end to line-end distance, distance 1550, using a portion 1555 of the hardmask layer 302. In some examples, the distance 1550 is above a typical minimum line-end to line-end distance for standard SALELE processes. The structure 1500 also includes a distance 1560 between portions of the hardmask 302, where the distance 1560 preserves a line width of the metal line patterns.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

While the foregoing is directed to embodiments of the present invention, other and further embodiments of the invention may be devised without departing from the basic scope thereof, and the scope thereof is determined by the claims that follow.

What is claimed is:

1. A method comprising:
    forming an initial mandrel structure on a first hardmask layer in a first direction by:
        patterning a first resist layer in a starting stack,
        applying a litho-etch process to remove a first portion of the first resist layer and first portion of a second hardmask layer to expose a first portion of a mandrel material layer in the starting stack,
        removing the first resist layer, and
        etching the exposed first portion of the mandrel material layer to form the initial mandrel structure, wherein the initial mandrel structure comprises a section of the mandrel material layer and a section of the second hardmask layer;
    forming a first mandrel and a second mandrel with a cut space, where the first mandrel and the second mandrel comprises a tip-to-tip distance across the cut space between the first mandrel and the second mandrel;
    forming a spacer layer on the first mandrel and the second mandrel, where the spacer layer fills a portion of the cut space;
    forming a next layer on the spacer layer to fill a remaining portion of the cut space;
    forming a final resist layer with a first critical dimension (CD) in a first cross-section and a second CD in a second cross-section to form a final resist stack; and
    processing the final resist stack to expose a first hardmask layer, where the first hardmask layer comprises a pattern for metal line structures with preserved line-end to line-end spaces corresponding to the cut space.

2. The method of claim 1, wherein forming the first mandrel and the second mandrel comprises:
    forming an organic planarization layer (OPL) on the first hardmask layer and the initial mandrel structure;
    forming a silicon containing Anti-Reflective Coating (SiARC) layer on the OPL;
    forming a second resist layer on the SiARC layer;
    patterning a cut space on the second resist layer;
    applying a litho-etch process to remove a cut portion of the second resist layer the SiARC layer, the OPL layer, and the second hardmask layer, wherein the cut portion comprises the tip-to-tip distance between the first and second mandrels and forms the cut space; and
    removing a remainder of the OPL layer, the SiARC layer, the second resist layer, and the first hardmask layer to form the first mandrel and the second mandrel.

3. The method of claim 1, wherein forming the spacer layer on the first mandrel and the second mandrel comprises:
    forming the spacer layer on a sidewall of the first mandrel facing the cut space and a sidewall of the second mandrel facing the cut space.

4. The method of claim 1, wherein forming the spacer layer on the first mandrel and the second mandrel comprises:
    forming the spacer layer on at least two outer sidewalls of the first mandrel and at least two outer sidewalls of the second mandrel.

5. The method of claim 1, wherein the tip-to-tip distance is greater than twice a thickness of the spacer layer, and wherein the spacer layer fills a portion of the cut space less than a total volume of the cut space.

6. The method of claim 1, wherein the next layer comprises spin on glass (SOG).

7. The method of claim 1, wherein forming the next layer further comprises:
    forming the next layer on portion of the spacer layer on each side of the first mandrel and the second mandrel; and
    etching the next layer to expose the spacer layer above the first mandrel and the second mandrel.

8. The method of claim 1, wherein forming the final resist stack further comprises:
    forming the final resist layer on the spacer layer and the next layer;

patterning a first resist section comprising the first CD in the final resist layer in the first cross-section;

patterning a second resist section comprising the second CD in the final resist layer in the second cross-section; and removing portions of the final resist layer to form the first and second resist sections in the final resist layer and first and second voids in removed portions of the final resist layer.

9. The method of claim 8, wherein the first CD is less than a width of the first mandrel and spacer layer in the first cross-section, and wherein the second CD in the second cross-section is equal to twice a thickness of the spacer layer and the width of the first mandrel.

10. The method of claim 8, wherein processing the final resist stack further comprises:

etching a portion of the next layer exposed in the first and second voids to expose portions of the spacer layer;
removing the final resist layer;
etching exposed portions of the spacer layer;
removing the first mandrel and the second mandrel;
etching exposed portions of the first hardmask layer;
removing remaining portions of the next layer; and
removing remaining portions of the spacer layer to expose a pattern for metal line structures in remaining portions of the first hardmask layer.

11. A resist stack comprising:
a first mandrel;
a second mandrel;
a cut space positioned between the first mandrel and the second mandrel comprising a tip-to-tip distance across the cut space between the first mandrel and the second mandrel;
a spacer layer formed on first mandrel, the second mandrel, and within a first portion of the cut space;
a next layer formed on the spacer layer, wherein the next layer fills a remaining portion of the cut space;
a resist layer formed on the spacer layer and the next layer comprising:
 a first patterned resist section comprising a first critical dimension (CD) in a first cross-section of the resist stack through the first mandrel; and
 a second patterned resist section comprising a second CD in a second cross-section of the resist stack through the cut space, wherein the first and second CDs are in a same direction and wherein the first CD is less than the second CD.

12. The resist stack of claim 11, wherein the spacer layer comprises a first section of the spacer layer formed on a sidewall of the first mandrel facing the cut space and a second section of the spacer layer formed on a sidewall of the second mandrel facing the cut space.

13. The resist stack of claim 11, wherein the spacer layer comprises first sidewall spacers formed on at least two outer sidewalls of the first mandrel, and second sidewall spacers formed on at least two outer sidewalls of the second mandrel.

14. The resist stack of claim 13, wherein the first patterned resist section is formed over a portion of the spacer layer covering the first mandrel, and wherein the first sidewall spacers are exposed in the resist stack.

15. The resist stack of claim 13, further comprising:
a third patterned resist section comprising the first CD in a third cross-section of the resist stack through the second mandrel, wherein the third patterned resist section is formed over a portion of the spacer layer covering the second mandrel, and wherein the second sidewall spacers are exposed in the resist stack.

16. The resist stack of claim 13, wherein the second CD is equal to a width of the first mandrel combined with a thickness of the first sidewall spacers.

17. The resist stack of claim 16, wherein the first CD and the second CD in the resist layer preserves the cut space and a line-end to line-end spacing between metal lines formed using a processed resist stack.

18. The resist stack of claim 11, wherein the tip-to-tip distance is greater than twice a thickness of the spacer layer, and wherein the first portion of the cut space is less than a total volume of the cut space.

19. A spacer assisted lithography-etch-lithography-etch (SALELE) method comprising:
forming a first mandrel and a second mandrel using a cut space;
forming a spacer layer on the first mandrel and the second mandrel, where the spacer layer fills a portion of the cut space;
forming a next layer on the spacer layer to fill a remaining portion of the cut space;
forming a final resist layer comprising a first critical dimension (CD) in a first cross-section through a mandrel of the first mandrel and the second mandrel and a second CD in a second cross-section through the cut space, to form a final resist stack, wherein the first and second CDs are in a same direction and wherein the first CD is less than the second CD; and
processing the final resist stack to expose a first hardmask layer, where the first hardmask comprises a pattern for metal line structures with preserved line-end to line-end spaces corresponding to the cut space.

* * * * *